United States Patent
Kim et al.

(10) Patent No.: US 12,356,831 B2
(45) Date of Patent: Jul. 8, 2025

(54) DISPLAY DEVICE

(71) Applicant: SAMSUNG DISPLAY CO., LTD., Yongin-si (KR)

(72) Inventors: Soung Wook Kim, Yongin-si (KR); Seok Gyu Yoon, Yongin-si (KR); Jun Yong Shin, Yongin-si (KR); Jin Soo Jung, Yongin-si (KR); Kun Wook Cho, Yongin-si (KR); Min Soo Choi, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 18/180,583

(22) Filed: Mar. 8, 2023

(65) Prior Publication Data
US 2024/0016028 A1 Jan. 11, 2024

(30) Foreign Application Priority Data
Jul. 8, 2022 (KR) .................. 10-2022-0084335

(51) Int. Cl.
*G09G 3/3233* (2016.01)
*G01N 21/55* (2014.01)
(Continued)

(52) U.S. Cl.
CPC ............. *H10K 59/65* (2023.02); *G01N 21/55* (2013.01); *G09G 3/3233* (2013.01);
(Continued)

(58) Field of Classification Search
CPC .... H10K 59/65; H10K 59/131; H10K 59/353; H10K 59/40; G09G 3/3233;
(Continued)

(56) References Cited

U.S. PATENT DOCUMENTS

2015/0179726 A1* 6/2015 Liu ................. H10K 50/16
257/40
2015/0248210 A1* 9/2015 Lee ................. G06F 1/3265
345/593
(Continued)

FOREIGN PATENT DOCUMENTS

KR 10-2006-0058569 5/2006
KR 10-2010-0082476 7/2010
(Continued)

*Primary Examiner* — Jose R Soto Lopez
(74) *Attorney, Agent, or Firm* — F. CHAU & ASSOCIATES, LLC

(57) ABSTRACT

A display device includes display pixels arranged in a display area of a display panel, near-infrared light emitting pixels alternately arranged with the display pixels, light sensing pixels alternately arranged with the display pixels, a display scan driver that supplies display scan signals to the display pixels and the near-infrared light emitting pixels, a component detection circuit that analyzes component information according to light sensing signals reflected from a front side by using the light sensing signals received from the light sensing pixels, and a main driving circuit that controls driving timings of the display pixels, the light emitting pixels, and the display scan driver.

18 Claims, 19 Drawing Sheets

USP1: SP1, SP2, SP3, ESP
USP2: SP1, SP2, SP3, LSP

(51) Int. Cl.
*H10K 59/131* (2023.01)
*H10K 59/35* (2023.01)
*H10K 59/65* (2023.01)
*G06F 3/044* (2006.01)
*H10K 50/11* (2023.01)

(52) U.S. Cl.
CPC ......... *H10K 59/131* (2023.02); *H10K 59/353* (2023.02); *G06F 3/0446* (2019.05); *G09G 2300/0452* (2013.01); *G09G 2300/0819* (2013.01); *G09G 2300/0842* (2013.01); *G09G 2310/08* (2013.01); *G09G 2354/00* (2013.01); *G09G 2360/145* (2013.01); *H10K 50/11* (2023.02)

(58) Field of Classification Search
CPC ......... G09G 2300/0426; G09G 3/3225; G09G 3/3266; G09G 2300/0439; G06F 3/0448
See application file for complete search history.

(56) References Cited

U.S. PATENT DOCUMENTS

| | | | |
|---|---|---|---|
| 2018/0174525 A1* | 6/2018 | Kim | G09G 3/3291 |
| 2019/0006435 A1* | 1/2019 | Chen | H10K 50/15 |
| 2020/0111851 A1* | 4/2020 | Park | H10K 39/32 |
| 2020/0334438 A1* | 10/2020 | Cheng | G06V 40/1318 |
| 2020/0335032 A1* | 10/2020 | Kiik | H04N 23/20 |
| 2020/0365099 A1* | 11/2020 | Lius | G09G 3/2074 |
| 2020/0402448 A1* | 12/2020 | Huang | G06F 21/32 |
| 2021/0013265 A1* | 1/2021 | Hinata | H10K 59/38 |
| 2021/0158751 A1* | 5/2021 | Cha | H10K 59/65 |
| 2021/0200366 A1* | 7/2021 | Bok | G06V 10/17 |
| 2021/0328198 A1* | 10/2021 | Umeda | H10K 59/351 |
| 2021/0332966 A1* | 10/2021 | Biwa | G09F 19/205 |
| 2022/0075979 A1* | 3/2022 | Han | G06V 40/1318 |
| 2022/0102430 A1* | 3/2022 | Yamazaki | G02B 5/22 |
| 2022/0110581 A1 | 4/2022 | Thubagere Jagadeesh | |
| 2022/0180798 A1* | 6/2022 | Karivaradaswamy | H04N 25/131 |
| 2022/0223812 A1* | 7/2022 | Watabe | H05B 33/02 |
| 2022/0238765 A1* | 7/2022 | Liu | H10H 20/8513 |
| 2022/0317520 A1* | 10/2022 | Takahata | A61L 2/0047 |
| 2022/0350432 A1* | 11/2022 | Takahashi | H10K 30/88 |
| 2022/0383783 A1* | 12/2022 | Yamazaki | G09G 3/3233 |
| 2022/0384398 A1* | 12/2022 | Yamazaki | H01L 25/13 |
| 2023/0054679 A1* | 2/2023 | Templier | H10K 59/65 |
| 2023/0103995 A1* | 4/2023 | Takahashi | H10K 59/65 257/40 |
| 2023/0108416 A1* | 4/2023 | Yin | G09G 3/3266 345/212 |
| 2023/0132555 A1* | 5/2023 | Inoue | G06V 10/145 257/40 |
| 2023/0247119 A1* | 8/2023 | Jung | G06F 1/1677 455/566 |
| 2023/0247873 A1* | 8/2023 | Kubota | G09F 9/302 257/40 |
| 2023/0276647 A1* | 8/2023 | Kawano | H10K 50/156 257/40 |
| 2023/0304864 A1* | 9/2023 | Barel | G09G 3/2003 |
| 2024/0114720 A1* | 4/2024 | Kubota | H10K 71/231 |

FOREIGN PATENT DOCUMENTS

| | | |
|---|---|---|
| KR | 10-2011-0018755 | 10/2011 |
| KR | 10-2022-0010890 | 1/2022 |

* cited by examiner

USP1: SP1, SP2, SP3, ESP
USP2: SP1, SP2, SP3, LSP

DISPLAY DEVICE

CROSS-REFERENCE TO RELATED APPLICATIONS

This application claims priority under 35 U.S.C. § 119 to Korean Patent Application No. 10-2022-0084335, filed on Jul. 8, 2022 in the Korean Intellectual Property Office, the disclosure of which is incorporated by reference herein in its entirety.

TECHNICAL FIELD

Embodiments of the present disclosure relate to a display device.

DISCUSSION OF RELATED ART

As technological advances are made, the demand for various types of display devices for displaying images has been increasing. Display devices are being applied to various electronic devices such as smartphones, digital cameras, laptop computers, tablet PCs, navigation devices, and smart televisions. A portable display device such as a smartphone or a tablet PC may be equipped with various functions such as image capturing, fingerprint recognition, and face recognition.

In recent years, devices for acquiring biometric information, such as skin moisture level or blood pressure, and component information of fruit or vegetables via an oscillometric method using a photosensor have been developed as advances are made in the optical industry and the semiconductor industry.

SUMMARY

Embodiments of the present disclosure provide a display device which can detect an optical signal in a near-infrared wavelength band using an image display panel and extract various component information as well as biometric information using the detected optical signal.

According to an embodiment of the disclosure, a display device includes display pixels arranged in a display area of a display panel, near-infrared light emitting pixels alternately arranged with the display pixels, light sensing pixels alternately arranged with the display pixels, a display scan driver that supplies display scan signals to the display pixels and the near-infrared light emitting pixels, a component detection circuit that analyzes component information according to light sensing signals reflected from a front side by using the light sensing signals received from the light sensing pixels, and a main driving circuit controlling driving timings of the display pixels, the light emitting pixels, and the display scan driver.

In an embodiment, the display pixels that display an image, the near-infrared light emitting pixels that emit near-infrared light, and the light sensing pixels that sense reflected light incident from the front side are arranged in a matrix along a first direction and a second direction perpendicular to the first direction.

In an embodiment, the display pixels, the near-infrared light emitting pixels, and the light sensing pixels are arranged in a horizontal stripe structure along the first direction or arranged in a vertical stripe structure along the second direction perpendicular to the first direction.

In an embodiment, three display pixels respectively displaying red light, green light and blue light, one near-infrared light emitting pixel, and one light sensing pixel form each unit pixel and are alternately arranged along the first direction, or three display pixels respectively displaying red light, green light and blue light, one near-infrared light emitting pixel, and one light sensing pixel form each unit pixel and are alternately arranged along the second direction.

In an embodiment, three display pixels respectively displaying red light, green light and blue light and one near-infrared light emitting pixel form each first unit pixel, three display pixels respectively displaying red light, green light and blue light and one light sensing pixel form each second unit pixel, and the first and second unit pixels are alternately arranged in a matrix along the first direction and the second direction.

In an embodiment, the first unit pixels and the second unit pixels are alternately arranged in a quad structure or a Pentile™ matrix structure along the first and second directions.

In an embodiment, three display pixels that respectively display red light, green light and blue light, one near-infrared light emitting pixel, and one light sensing pixel form each unit pixel, and the unit pixels are alternately arranged in a Pentile™ matrix structure along the first and second directions.

In an embodiment, in each of the unit pixels arranged in the Pentile™ matrix structure, the red, blue and green display pixels and the near-infrared light emitting pixel are respectively disposed at top, bottom, left, and right positions in a rhombus structure, and the light sensing pixel is disposed in a central area of the red, green and blue display pixels and the near-infrared light emitting pixel.

In an embodiment, each of the near-infrared light emitting pixels receives a data voltage of a data wiring according to a display scan signal and an emission control signal from the display scan driver and emits near-infrared light by supplying a driving current to a light emitting element according to the data voltage, and the data voltage applied to each near-infrared light emitting pixel is the same voltage as a data voltage applied to each blue display pixel.

In an embodiment, the display device further includes a light sensing driver that sequentially supplies sensing scan signals to the light sensing pixels. The light sensing pixels generate light sensing signals corresponding to amounts of reflected light incident from the front side and transmit the light sensing signals to the component detection circuit by sequentially responding to the sensing scan signals received through light sensing scan wirings.

In an embodiment, the light sensing pixels generate light sensing signals corresponding to amounts of reflected light incident from the front side and transmit the light sensing signals to the component detection circuit by sequentially responding to the display scan signals received from the display scan driver through display scan wirings.

In an embodiment, the component detection circuit modulates the light sensing signals of the light sensing pixels respectively received through light sensing wirings into digital signals and generates, outputs and stores component detection data by analyzing the digital light sensing signals using a preset component analysis algorithm or component analysis program.

In an embodiment, the main driving circuit generates digital video data corresponding to the component detection data according to the component detection data analyzed by the component detection circuit, or executes an application program that displays the component detection data in text or graphic form and generates the digital video data such that the component detection data is displayed in the display area in text or graphic form according to the graphic form and type of the application program.

In an embodiment, each of the near-infrared light emitting pixels includes a light emitting unit that emits near-infrared light, and a pixel driving unit that supplies a driving current to a light emitting element of the light emitting unit.

In an embodiment, the light emitting element of the light emitting unit includes at least one organic material including, for example, copper phthalocyanine (CuPc), N,N'-Di(naphthalene-1-yl)-N,N'-diphenyl-benzidine (NPB) and tris-8-hydroxyquinoline aluminum (Alq3), and emits light in a blue wavelength band, and a wavelength conversion layer is disposed on a front surface of the light emitting unit and shifts the light in the blue wavelength band to light in a near-infrared wavelength band and outputs the light in the near-infrared wavelength band.

In an embodiment, the light emitting element of the light emitting unit includes at least one organic material including, for example, a low molecular weight boron-dipyrromethene derivative (BODIPY-Ph), acetone containing a low molecular weight boron-dipyrromethene derivative (BODIPY-Ph), hydrocarbon (e.g., rubrene), N,N'-Di(naphthalen-1-yl)-N,N'-diphenyl-benzidine (NPB) and tris-8-hydroxyquinoline aluminum (Alq3) to emit light in a near-infrared wavelength band.

In an embodiment, the light emitting element of the light emitting unit includes at least one organic material that emits light in a blue wavelength band, and a wavelength conversion layer is attached to a front surface or a rear surface of a cover window disposed on a front surface of the light emitting unit and shifts the light in the blue wavelength band to light in a near-infrared wavelength band and outputs the light in the near-infrared wavelength band.

In an embodiment, light transmission holes are respectively formed in areas where the near-infrared light emitting pixels are formed, and a near-infrared light emitting panel that outputs near-infrared light through the light transmission holes is disposed on a rear surface of the display panel. The near-infrared light emitting panel includes one or more near-infrared light emitting elements respectively disposed at positions corresponding to the light transmission holes.

According to an embodiment of the disclosure, a display device includes display pixels arranged in a display area of a display panel, near-infrared light emitting pixels alternately arranged with the display pixels, light sensing pixels alternately arranged with the display pixels, a display scan driver that supplies display scan signals to the display pixels and the near-infrared light emitting pixels, a light sensing driver that sequentially supplies sensing scan signals to the light sensing pixels, a component detection circuit that analyzes component information according to light sensing signals reflected from a front side by using the light sensing signals received from the light sensing pixels, a touch sensing circuit that detects a user's touch and coordinate data of a touch position through touch electrodes of a touch sensing unit, and a main driving circuit that controls driving timings of the display pixels, the light emitting pixels, the light sensing driver, and the display scan driver.

In an embodiment, the component detection circuit modulates the light sensing signals of the light sensing pixels respectively received through light sensing wirings into digital signals and generates, outputs and stores component detection data by analyzing the digital light sensing signals using a preset component analysis algorithm or component analysis program.

In display devices according to embodiments, when light emitted from image display pixels and near-infrared light emitting pixels is reflected by an object such as a body part, vegetable, fruit or plant, the reflected light may be sensed using light sensing pixels of a display panel to detect optical signals. In addition, the detected optical signals may be analyzed to extract various component information of the object. For example, since various component information of the object is extracted using the near-infrared light emitting pixels and the light sensing pixels arranged together with the image display pixels, application fields and utilization of the display devices can be further increased.

BRIEF DESCRIPTION OF THE DRAWINGS

The above and other features of the present invention will become more apparent by describing in detail embodiments thereof with reference to the accompanying drawings, in which.

DETAILED DESCRIPTION

Figure 1:
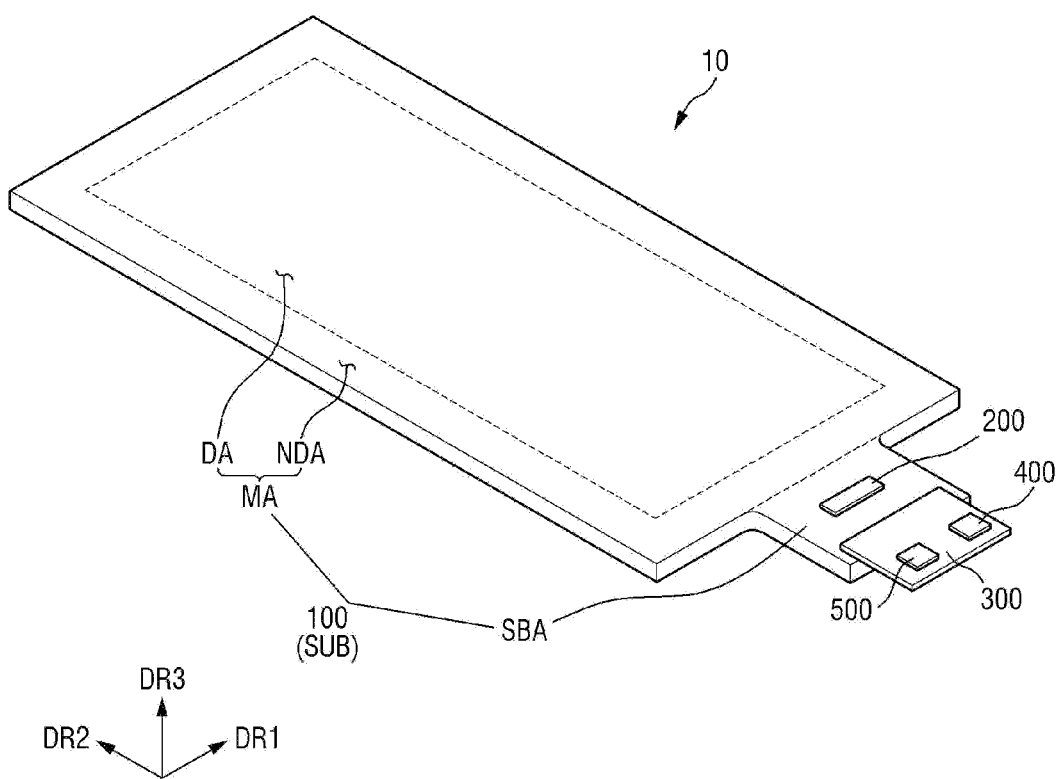
FIG. 1 is a perspective view of a display device according to an embodiment.

Embodiments of the present disclosure will be described more fully hereinafter with reference to the accompanying drawings. Like reference numerals may refer to like elements throughout the accompanying drawings.

It will be understood that when a component such as a film, a region, a layer, etc., is referred to as being "on", "connected to", "coupled to", or "adjacent to" another component, it can be directly on, connected, coupled, or adjacent to the other component, or intervening components may be present. It will also be understood that when a component is referred to as being "between" two components, it can be the only component between the two components, or one or more intervening components may also be present. It will also be understood that when a component is referred to as "covering" another component, it can be the only component covering the other component, or one or more intervening components may also be covering the other component. Other words used to describe the relationships between components should be interpreted in a like fashion.

It will be understood that the terms "first," "second," "third," etc. are used herein to distinguish one element from another, and the elements are not limited by these terms. Thus, a "first" element in an embodiment may be described as a "second" element in another embodiment.

Each of the features of the various embodiments of the present disclosure may be combined or combined with each other, in part or in whole, and technically various interlocking and driving are possible. Each embodiment may be implemented independently of each other or may be implemented together in an association.

Herein, when two or more elements or values are described as being substantially the same as or about equal to each other, it is to be understood that the elements or values are identical to each other, the elements or values are equal to each other within a measurement error, or if measurably unequal, are close enough in value to be functionally equal to each other as would be understood by a person having ordinary skill in the art. For example, the term "about" as used herein is inclusive of the stated value and means within an acceptable range of deviation for the particular value as determined by one of ordinary skill in the art, considering the measurement in question and the error associated with measurement of the particular quantity (e.g., the limitations of the measurement system). For example, "about" may mean within one or more standard deviations as understood by one of the ordinary skill in the art. Further, it is to be understood that while parameters may be described herein as having "about" a certain value, according to exemplary embodiments, the parameter may be exactly the certain value or approximately the certain value within a measurement error as would be understood by a person having ordinary skill in the art. Other uses of these terms and similar terms to describe the relationships between components should be interpreted in a like fashion.

Figure 2:
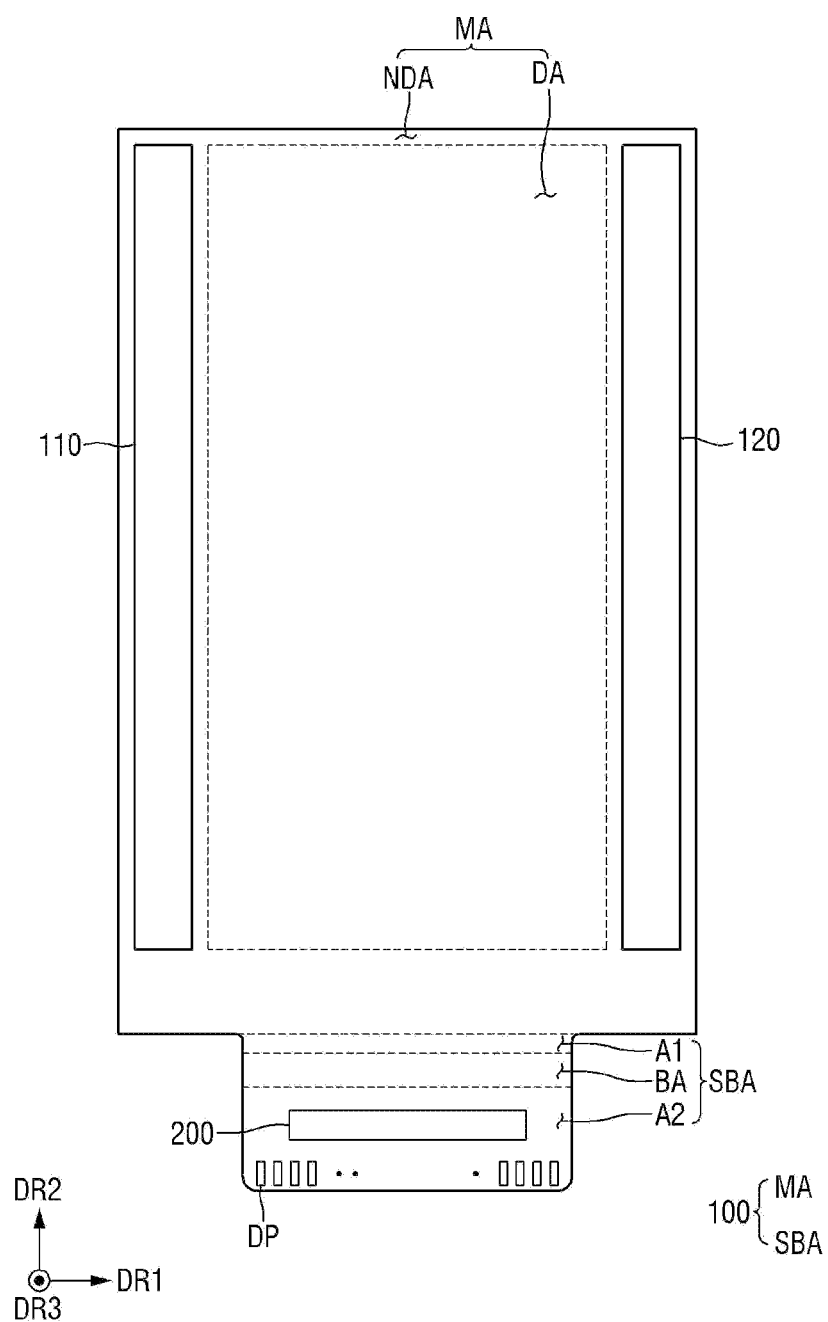
FIG. 2 is a plan view illustrating the arrangement structure of a display panel and a display driving circuit illustrated in FIG. 1 according to an embodiment.

FIG. 1 is a perspective view of a display device 10 according to an embodiment. FIG. 2 is a plan view illustrating the arrangement structure of a display panel 100 and a display driving circuit illustrated in FIG. 1 according to an embodiment.

Referring to FIGS. 1 and 2, the display device 10 according to an embodiment may be applied to portable electronic devices such as, for example, mobile phones, smartphones, tablet personal computers (PCs), mobile communication terminals, electronic notebooks, electronic books, portable multimedia players (PMPs), navigation devices, and ultra-mobile PCs (UMPCs). Alternatively, the display device 10 according to an embodiment may be applied as a display unit of, for example, a television, a laptop computer, a monitor, a billboard, or an Internet of Things (IoT) device. Alternatively, the display device 10 according to an embodiment may be applied to wearable devices such as, for example, smartwatches, watch phones, glass-like displays, and head-mounted displays (HMDs). Alternatively, the display device 10 according to an embodiment may be applied to, for example, a dashboard of a vehicle, a center fascia of a vehicle, a center information display (CID) disposed on a dashboard of a vehicle, or a display disposed on the back of a front seat as an entertainment device for rear-seat passengers of a vehicle.

The display device 10 may be a light emitting display device such as, for example, an organic light emitting display device using an organic light emitting diode, a quantum dot light emitting display device including a quantum dot light emitting layer, an inorganic light emitting display device including an inorganic semiconductor, or a micro- or nano-light emitting display device using a micro- or nano-light emitting diode. A case in which the display device 10 is an organic light emitting display device will be mainly described below, but embodiments of the present disclosure are not limited thereto.

The display panel 100 may have a rectangular shape having short sides in a first direction DR1 and long sides in a second direction DR2 intersecting the first direction DR1. Each corner where a short side extending in the first direction DR1 meets a long side extending in the second direction DR2 may be right-angled or may be rounded with a predetermined curvature. The planar shape of the display panel 100 is not limited to a quadrilateral shape, but may also be, for example, another polygonal shape, a circular shape, or an oval shape. The display panel 100 may be formed flat, but embodiments of the present disclosure are not limited thereto. For example, the display panel 100 may include curved portions formed at left and right ends and having a constant or varying curvature according to embodiments. In addition, the display panel 100 may be formed to be flexible so that it can be curved, bent, folded, or rolled.

A substrate SUB of the display panel 100 may be divided into a main area MA and a sub-area SBA.

The main area MA may be divided into a display area DA in which an image is displayed and a non-display area NDA located around the display area DA in which an image is not displayed.

The non-display area NDA may neighbor the display area DA. The non-display area NDA may be an area outside the display area DA. The non-display area NDA may surround the display area DA. The non-display area NDA may be an edge area of the display panel 100.

The display area DA includes display pixels that display an image, near-infrared light emitting pixels that emit near-infrared light, and light sensing pixels that sense light reflected from an object placed in front of the display area DA, such as, for example, a part of a user's body, a vegetable, fruit or a plant. The display area DA may occupy most of the main area MA. The display area DA may be disposed in a center of the main area MA.

The sub-area SBA may include a first area A1, a second area A2, and a bending area BA.

The first area A1 is an area protruding from a side of the main area MA in the second direction DR2. A side of the first area A1 may contact the non-display area NDA of the main area MA, and the other side of the first area A1 may contact the bending area BA.

The second area A2 is an area in which pads DP and a main driving circuit 200 are disposed. The main driving circuit 200 may be attached to driving pads of the second area A2 using a conductive adhesive member such as an anisotropic conductive film. A circuit board 300 may be attached to the pads DP of the second area A2 using a conductive adhesive member. A side of the second area A2 may contact the bending area BA.

The bending area BA is an area that is bent/bendable. When the bending area BA is bent, the second area A2 may be disposed under the first area A1 and under the main area MA.

The bending area BA may be disposed between the first area A1 and the second area A2. A side of the bending area BA may contact the first area A1, and the other side of the bending area BA may contact the second area A2.

Figure 3:
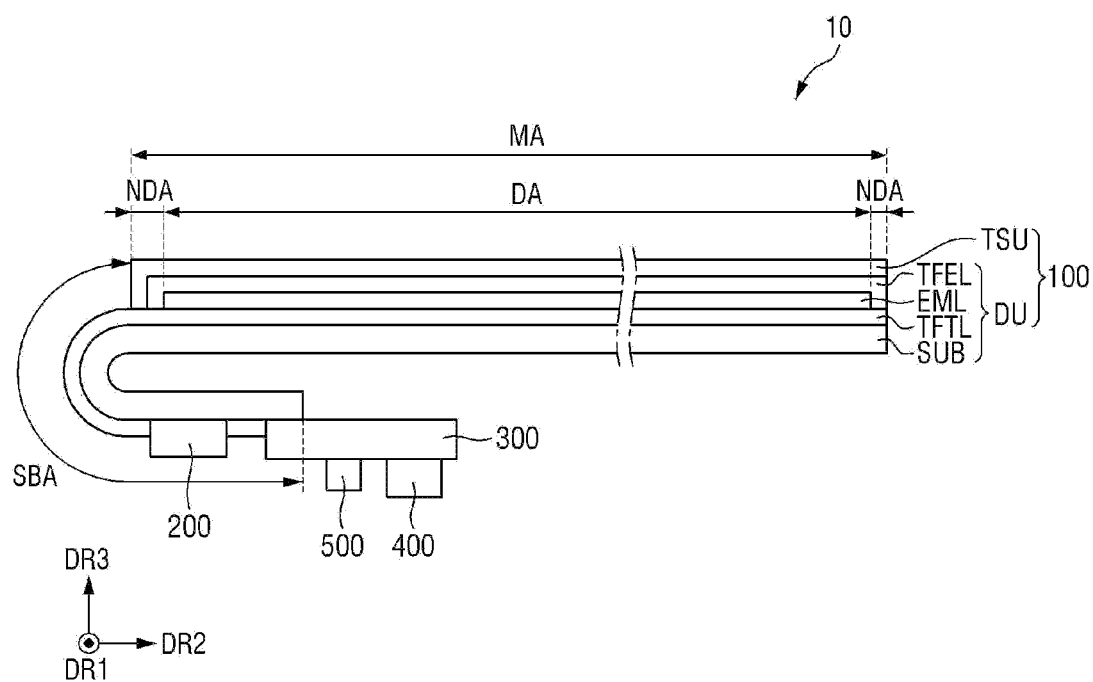
FIG. 3 is a side view illustrating the configuration of the display device of FIG. 1 in detail according to an embodiment.

FIG. 3 is a side view illustrating the configuration of the display device 10 of FIG. 1 in detail according to an embodiment.

Referring to FIG. 3, the sub-area SBA may protrude from a side of the main area MA in the second direction DR2. A length of the sub-area SBA in the second direction DR2 may be smaller than a length of the main area MA in the second direction DR2. In FIG. 3, the display module DU includes a thin-film transistor layer TFTL disposed on the substrate SUB, a light emitting layer EML disposed on the thin-film transistor layer TFTL, and an encapsulation layer TFEL disposed on the light emitting layer EML.

A length or area of the sub-area SBA in the first direction DR1 may be smaller than a length or area of the main area MA in the first direction DR1, or may be substantially equal to the length or area of the main area MA in the first direction DR1. The sub-area SBA may be bent, and in this case, may be disposed under the main area MA. The sub-area SBA may overlap the main area MA in a third direction DR3.

A touch sensing unit TSU that senses a touch position of a body part such as a finger may be disposed in a front portion of the display panel 100 including the display area DA. The touch sensing unit TSU may include a plurality of touch electrodes that sense a user's touch in a capacitive manner.

The touch sensing unit TSU includes a plurality of touch electrodes arranged to cross each other in the first and second directions DR1 and DR2. For example, the touch electrodes may be formed to extend in a wiring area (or a non-image display area in which wirings are formed) between display pixels and light sensing pixels so as not to overlap the display pixels and the light sensing pixels arranged in the display area DA. The touch electrodes may form mutual capacitance to transmit touch sensing signals, which vary according to a user's touch, to a touch sensing circuit 500.

The touch sensing circuit 500 may sense a change in mutual capacitance between the touch electrodes input from the touch electrodes, and transmit touch data according to the change in capacitance and coordinate data of a position where a touch has been sensed to the main driving circuit 200.

The circuit board 300 may be attached to an end of the sub-area SBA. The touch sensing circuit 500 may be mounted on the circuit board 300 and electrically connected to the touch electrodes of the touch sensing unit TSU. In addition, the circuit board 300 may be electrically connected to the display panel 100 and the main driving circuit 200.

The display panel 100 and the main driving circuit 200 may receive, for example, digital video data, timing signals, and driving voltages through the circuit board 300. The circuit board 300 may be, for example, a flexible printed circuit board, a printed circuit board, or a flexible film such as a chip on film.

The main driving circuit 200 may generate digital data and electrical control signals used to drive the display panel 100. Each of a component detection circuit 400 and the touch sensing circuit 500 as well as the main driving circuit 200 may be formed as an integrated circuit. Each of the main driving circuit 200, the component detection circuit 400, and the touch sensing circuit 500 may be attached onto the display panel 100 or the circuit board 300 using, for example, a chip on glass (COG) method, a chip on plastic (COP) method, or an ultrasonic bonding method. However, embodiments of the present disclosure are not limited thereto. For example, the component detection circuit 400 and the touch sensing circuit 500 as well as the main driving circuit 200 may also be attached onto the circuit board 300 using a chip on film (COF) method.

Figure 4:
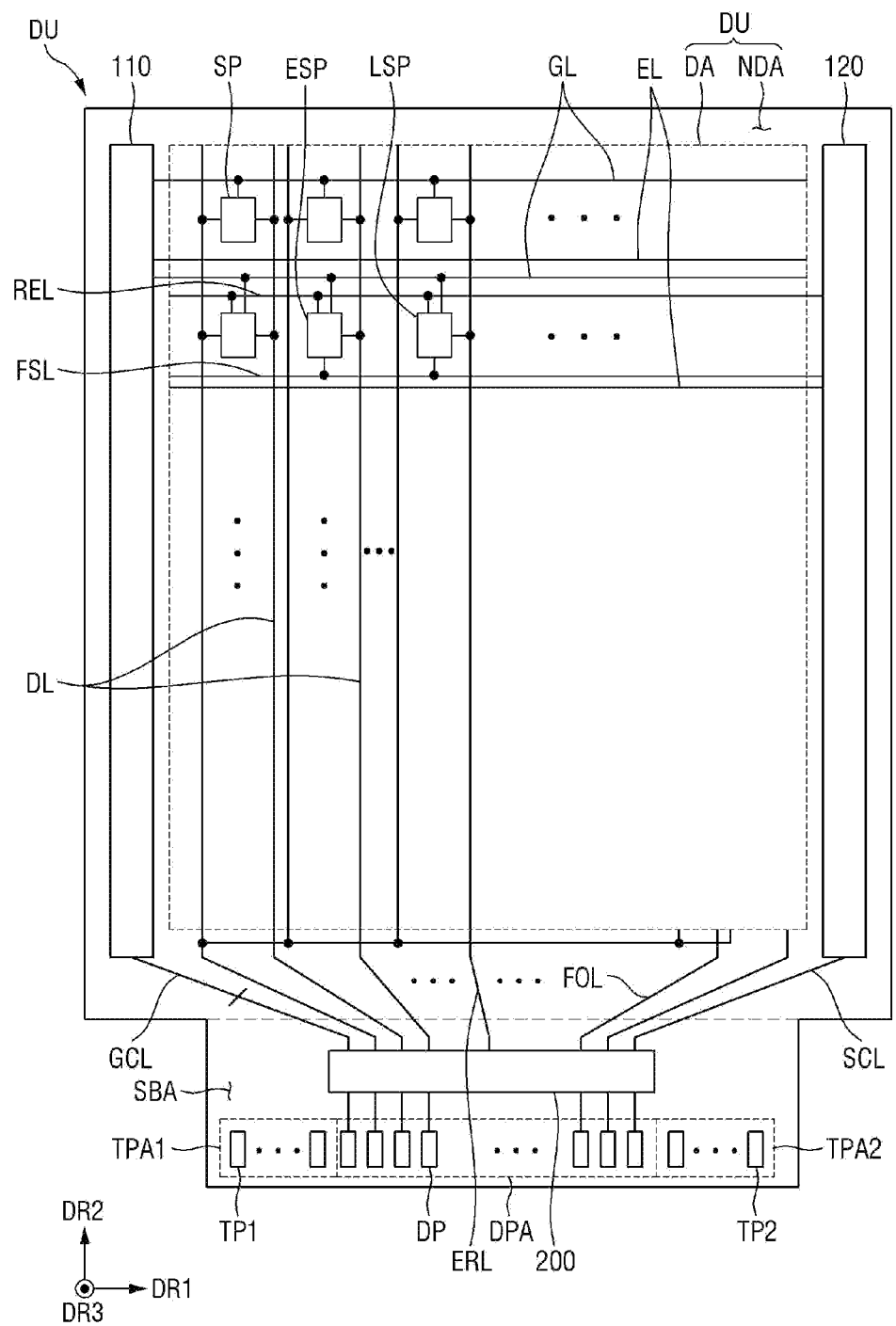
FIG. 4 is a schematic layout view of an example of the display panel illustrated in FIGS. 1 through 3.

FIG. 4 is a schematic layout view of an example of the display panel 100 illustrated in FIGS. 1 through 3. For example, FIG. 4 is a layout view illustrating the display area DA and the non-display area NDA of a display module DU before the touch sensing unit TSU is formed.

Referring to FIG. 4, a display scan driver 110, a light sensing scan driver 120, and the main driving circuit 200 may be disposed on the display panel 100 of the display device 10 according to an embodiment. In addition, the component detection circuit 400, the touch sensing circuit 500, and a power supply unit may be disposed on the circuit board 300 connected to the display panel 100. Here, the main driving circuit 200, the component detection circuit 400, and the touch sensing circuit 500 may be integrally formed as a one-chip type and mounted on the display panel 100 or the circuit board 300. However, for ease of functional description, an example in which the main driving circuit 200, the component detection circuit 400, and the touch sensing circuit 500 are formed as different integrated circuits will be described below.

Referring to FIG. 4, the display panel 100 may include display pixels SP, near-infrared light emitting pixels ESP, light sensing pixels LSP, display scan wirings GL, emission control wirings EL, data wirings DL, light sensing scan wirings FSL, sensing reset wirings REL, and light sensing wirings ERL disposed in the display area DA. Each of the display scan driver 110 and the light sensing scan driver 120 may be disposed in the non-display area NDA.

The display scan wirings GL sequentially supply display scan signals received from the display scan driver 110 in units of horizontal lines to a plurality of display pixels SP for each horizontal line. In addition, the display scan signals may be supplied to the near-infrared light emitting pixels ESP through the display scan wirings GL. The display scan wirings GL may extend in the first direction DR1 and may be spaced apart from each other in the second direction DR2 intersecting the first direction DR1.

The emission control wirings EL sequentially supply emission control signals received from the display scan driver 110 in units of horizontal lines to a plurality of display pixels SP for each horizontal line. In addition, the emission control signals may be supplied to the near-infrared emission pixels ESP through the emission control wirings EL. The emission control wirings EL may extend in the first direction DR1 in parallel with the display scan wirings GL and may be spaced apart from each other in the second direction DR2 intersecting the first direction DR1.

The data wirings DL may supply data voltages received from the main driving circuit 200 to the display pixels SP and the near-infrared light emitting pixels ESP. The data wirings DL may extend in the second direction DR2 and may be spaced apart from each other in the first direction DR1.

The light sensing scan wirings FSL sequentially supply sensing scan signals received from the light sensing scan driver 120 in units of horizontal lines to the light sensing pixels LSP. The light sensing scan wirings FSL may extend in the first direction DR1 and may be spaced apart from each other in the second direction DR2 intersecting the first direction DR1.

The sensing reset wirings REL sequentially supply sensing reset signals received from the light sensing scan driver 120 in units of horizontal lines to the light sensing pixels LSP for each horizontal line. The sensing reset wirings REL may extend in the first direction DR1 in parallel with the light sensing scan wirings FSL and may be spaced apart from each other in the second direction DR2 intersecting the first direction DR1.

The light sensing wirings ERL are connected between the light sensing pixels LSP and the component detection circuit 400, and supply light sensing signals output from the light sensing pixels LSP to the component detection circuit 400. The light sensing wirings ERL may lie and extend in the second direction DR2 according to the placement direction of the component detection circuit 400 and may be spaced apart from each other in the first direction DR1.

The non-display area NDA may surround the display area DA. The display scan driver 110, the light sensing scan driver 120, fan-out wirings FOL, display control wirings GCL, and light sensing control wirings SCL may be disposed in the non-display area NDA.

The display pixels SP that display an image, the near-infrared light emitting pixels ESP that emit near-infrared light, and the light sensing pixels LSP that sense reflected light incident from a front side of the display device 10 may be arranged in a matrix in the first direction DR1 and the second direction DR2. For example, the display pixels SP, the near-infrared light emitting pixels ESP, and the light sensing pixels LSP may be arranged in a horizontal stripe structure along the first direction DR1 or may be arranged in a vertical stripe structure along the second direction DR2.

For example, three display pixels SP that respectively display red light, green light and blue light, one near-infrared light emitting pixel ESP, and one light sensing pixel LSP may form each unit pixel and may be alternately arranged along the first direction DR1.

Alternatively, three display pixels SP that respectively display red light, green light and blue light, one near-infrared light emitting pixel ESP, and one light sensing pixel LSP may form each unit pixel and may be alternately arranged along the second direction DR2.

As another example, three display pixels SP that respectively display red light, green light and blue light and one near-infrared light emitting pixel ESP may form each first unit pixel. In addition, three display pixels SP that respectively display red light, green light and blue light and one light sensing pixel LSP may form each second unit pixel. Accordingly, the first and second unit pixels may be alternately arranged in a matrix along the first direction DR1 and the second direction DR2. The first unit pixels and the second unit pixels may be arranged in a quad structure or a Pentile™ matrix structure.

As another example, three display pixels SP that respectively display red light, green light and blue light, one near-infrared light emitting pixel ESP, and one light sensing pixel LSP may form each unit pixel and may be arranged in a Pentile™ matrix structure of five-subpixel structures. In the Pentile™ matrix structure of five-subpixel structures, red, green and blue display pixels SP and a near-infrared light emitting pixel ESP may be respectively disposed at top, bottom, left, and right positions in a rhombus structure, and a light sensing pixel LSP may be disposed in a central area of the red, green and blue display pixels SP and the near-infrared light emitting pixel ESP.

Each of the red, green and blue display pixels SP and the near-infrared light emitting pixel ESP may be connected to any one of the display scan wirings GL and any one of the emission control wirings EL.

Each of the display pixels SP may receive a data voltage of a data wiring DL according to a display scan signal of a display scan wiring GL and an emission control signal of an emission control wiring EL, and may emit light by supplying a driving current to a light emitting element according to the data voltage. Each of the near-infrared light emitting pixels ESP may also receive a data voltage of a data wiring DL according to a display scan signal and an emission control signal, and may emit light by supplying a driving current to a light emitting element according to the data voltage. The data voltage applied to each of the near-infrared light emitting pixels ESP may be the same voltage as the data voltage applied to each of the blue display pixels SP.

Each of the light sensing pixels LSP may be connected to one of the light sensing scan wirings FSL, one of the sensing reset wirings REL, and one of the light sensing wirings ERL. Each of the light sensing pixels LSP may be reset in response to a sensing reset signal received from a sensing reset wiring REL and may generate a light sensing signal corresponding to the amount of reflected light incident from the front side. In addition, each of the light sensing pixels LSP may transmit the light sensing signal to a light sensing wiring ERL in response to a sensing scan signal received from a light sensing scan wiring FSL.

Alternatively, each of the light sensing pixels LSP may be connected to one of the display scan wirings GL in units of horizontal lines. Each of the light sensing pixels LSP may generate a light sensing signal corresponding to the amount of reflected light incident from the front side, and output the light sensing signal to a light sensing wiring ERL in response to a display scan signal received through a display scan wiring GL.

The display scan driver 110 may be disposed in the non-display area NDA. Although the display scan driver 110 is disposed on a side (e.g., a left side) of the display panel 100 in FIG. 4, embodiments of the present disclosure are not limited thereto. For example, the display scan driver 110 may also be disposed on both sides (e.g., left and right sides) of the display panel 100 according to embodiments.

The display scan driver 110 may be electrically connected to the main driving circuit 200 through display control wirings GCL. The display scan driver 110 receives a scan control signal from the main driving circuit 200, sequentially generates display scan signals in units of horizontal line driving periods according to the scan control signal, and sequentially supplies the display scan signals to the display scan wirings GL. In addition, the display scan driver 110 may sequentially generate emission control signals according to the scan control signal from the main driving circuit 200 and sequentially supply the emission control signals to the emission control wirings EL.

The display control wirings GCL may extend from the main driving circuit 200 to the display scan driver 110 according to the placement position of the display scan driver 110. The display control wirings GCL may supply a scan control signal received from the main driving circuit 200 to the display scan driver 110.

The light sensing scan driver 120 may be disposed in a different part of the non-display area NDA different from the display scan driver 110. Although the light sensing scan driver 120 is disposed on the other side (e.g., the right side) of the display panel 100 in FIG. 4, embodiments of the present disclosure are not limited thereto. The light sensing scan driver 120 may be electrically connected to the main driving circuit 200 through the light sensing control wirings SCL. The light sensing scan driver 120 receives a light sensing control signal from the main driving circuit 200 and sequentially generates reset control signals and sensing scan signals in units of horizontal line driving periods according to the light sensing control signal. Then, the light sensing scan driver 120 sequentially supplies the sequentially generated reset control signals to the sensing reset wirings REL. In addition, the light sensing scan driver 120 may sequentially generate the sensing scan signals according to the light sensing control signal received from the main driving circuit 200 and sequentially supply the sensing scan signals to the light sensing scan wirings FSL.

The light sensing control wirings SCL may extend from the main driving circuit 200 to the light sensing scan driver 120 according to the placement position of the light sensing scan driver 120. The light sensing control wirings SCL may supply a light sensing control signal received from the main driving circuit 200 to the light sensing scan driver 120.

The sub-area SBA may include the main driving circuit 200, a display pad area DPA, and first and second touch pad areas TPA1 and TPA2 respectively including first and second touch pads TP1 and TP2. The display pad area DPA, the first touch pad area TPA1, and the second touch pad area TPA2 may be disposed at an edge of the sub-area SBA. The display pad area DPA, the first touch pad area TPA1, and the second touch pad area TPA2 may be electrically connected to the circuit board 300 using, for example, an anisotropic conductive film or a low-resistance high-reliability material such as SAP.

The fan-out wirings FOL may extend from the main driving circuit 200 to the display area DA. In addition, the fan-out wirings FOL are connected so that a data voltage received from the main driving circuit 200 can be supplied to each of the data wirings DL.

The main driving circuit 200 may output signals and voltages for driving the display panel 100 to the fan-out wirings FOL. The main driving circuit 200 may supply data voltages to the data wirings DL through the fan-out wirings FOL. The data voltages may be supplied to the display pixels SP and may determine luminances of the display pixels SP. The main driving circuit 200 may supply a scan control signal to the display scan driver 110 through the display control wirings GCL.

The main driving circuit 200 may generate digital video data according to component detection data analyzed by the component detection circuit 400 or may execute an application program that displays the component detection data in text or graphic form. For example, the main driving circuit 200 may execute an application program or a preset program and display the component detection data in text or graphic form according to the graphic form and type of the program.

The component detection circuit 400 modulates light sensing signals of the light sensing pixels LSP received through the light sensing wirings ERL into digital signals. Then, the component detection circuit 400 generates and stores component detection data by analyzing the digital light sensing signals using, for example, a preset component analysis algorithm or component analysis program. The component detection data may be transmitted to and shared by the main driving circuit 200.

Figure 5:
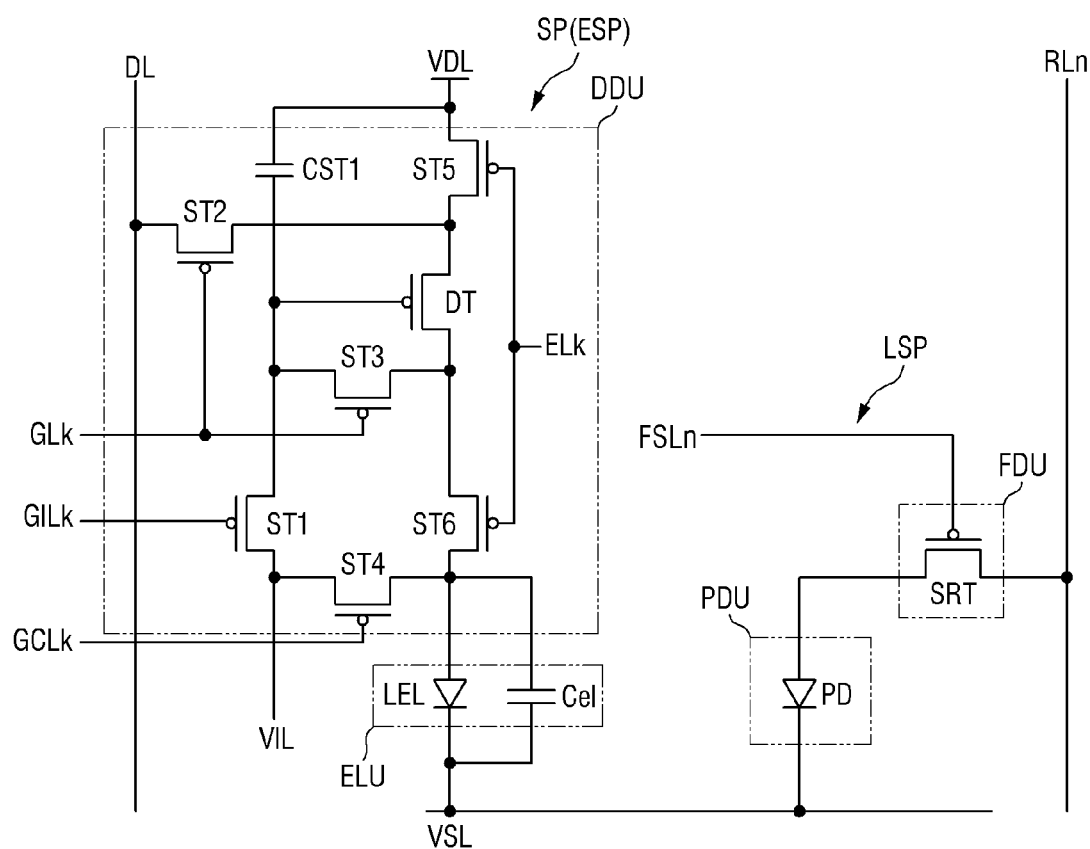
FIG. 5 is a circuit diagram of a display pixel, a near-infrared light emitting pixel, and a light sensing pixel according to an embodiment.

FIG. 5 is a circuit diagram of a display pixel SP, a near-infrared light emitting pixel ESP, and a light sensing pixel LSP according to an embodiment.

Referring to FIG. 5, each of the display pixel SP and the near-infrared light emitting pixel ESP according to an embodiment may be connected to a $k^{th}$ display initialization wiring GILk, a $k^{th}$ display write wiring GLk, and a $k^{th}$ display control wiring GCLk. In addition, each of the display pixel SP and the near-infrared light emitting pixel ESP may be connected to a first driving voltage wiring VDL to which a first driving voltage is supplied, a second driving voltage wiring VSL to which a second driving voltage is supplied, and a third driving voltage wiring VIL to which a third driving voltage is supplied. The letters k and n used in place of numbers herein are positive integers or natural numbers excluding 0.

The display pixel SP and the near-infrared light emitting pixel ESP may be formed in the same circuit structure. For example, the near-infrared light emitting pixel ESP may be formed in the same circuit structure as a blue display pixel SP. The circuit structure of one display pixel SP will be described below as an example.

The display pixel SP may include a light emitting unit ELU and a pixel driving unit DDU. The light emitting unit ELU refers to a component capable of emitting light, and may include a light emitting element LEL. The light emitting unit ELU may also be referred to herein as a light emitter. The pixel driving unit DDU may include a driving transistor DT, switch elements, and a capacitor CST1. The switch elements include first through sixth transistors ST1 through ST6.

The driving transistor DT may include a gate electrode, a first electrode, and a second electrode. The driving transistor DT controls a drain-source current Ids (hereinafter, referred to as a "driving current") flowing between the first electrode and the second electrode according to a data voltage applied to the gate electrode. The driving current Ids flowing through a channel of the driving transistor DT is proportional to the square of a difference between a voltage Vsg between the first electrode and the gate electrode of the driving transistor DT and a threshold voltage, as shown in Equation 1.

$$Ids = k' \times (Vsg - Vth)^2, \quad (1)$$

where k' is a proportional coefficient determined by the structure and physical characteristics of the driving transistor DT, Vsg is a voltage between the first electrode and the gate electrode of the driving transistor DT, and Vth is a threshold voltage of the driving transistor DT.

The light emitting element LEL emits light according to the driving current Ids. As the driving current Ids increases, the amount of light emitted from the light emitting element LEL may increase.

The light emitting element LEL may be, for example, an organic light emitting diode including an organic light emitting layer disposed between an anode and a cathode.

Alternatively, the light emitting element LEL may be, for example, an inorganic light emitting element including an inorganic semiconductor disposed between an anode and a cathode. Alternatively, the light emitting element LEL may be, for example, a quantum dot light emitting element including a quantum dot light emitting layer disposed between an anode and a cathode. Alternatively, the light emitting element LEL may be, for example, a micro-light emitting element including a micro-light emitting diode disposed between an anode and a cathode.

The anode of the light emitting element LEL may be connected to a first electrode of the fourth transistor ST4 and a second electrode of the sixth transistor ST6, and the cathode of the light emitting element LEL may be connected to the second driving voltage wiring VSL. A parasitic capacitance Cel may be formed between the anode and the cathode of the light emitting element LEL.

The first transistor ST1 is turned on by an initialization scan signal of the $k^{th}$ display initialization wiring GILk to connect the gate electrode of the driving transistor DT to the third driving voltage wiring VIL. Therefore, the third driving voltage VINT of the third driving voltage wiring VIL may be applied to the gate electrode of the driving transistor DT. The first transistor ST1 may have a gate electrode connected to the $k^{th}$ display initialization wiring GILk, a first electrode connected to the gate electrode of the driving transistor DT, and a second electrode connected to the third driving voltage wiring VIL.

The second transistor ST2 is turned on by a display scan signal of the $k^{th}$ display write wiring GLk to connect the first electrode of the driving transistor DT to an $n^{th}$ data wiring Dn. Therefore, a data voltage of the $n^{th}$ data wiring Dn may be applied to the first electrode of the driving transistor DT. The second transistor ST2 may have a gate electrode connected to the $k^{th}$ display write wiring GLk, a first electrode connected to the first electrode of the driving transistor DT, and a second electrode connected to the $n^{th}$ data wiring Dn.

The third transistor ST3 is turned on by the display scan signal of the $k^{th}$ display write wiring GLk to connect the gate electrode and the second electrode of the driving transistor DT. When the gate electrode and the second electrode of the driving transistor DT are connected, the driving transistor DT operates as a diode. The third transistor ST3 may have a gate electrode connected to the $k^{th}$ display write wiring GLk, a first electrode connected to the second electrode of the driving transistor DT, and a second electrode connected to the gate electrode of the driving transistor DT.

The fourth transistor ST4 is turned on by a display control signal of the $k^{th}$ display control wiring GCLk to connect the anode of the light emitting element LEL to the third driving voltage wiring VIL. The third driving voltage of the third driving voltage wiring VIL may be applied to the anode of the light emitting element LEL. The fourth transistor ST4 has a gate electrode connected to the $k^{th}$ display control wiring GCLk, the first electrode connected to the anode of the light emitting element LEL, and a second electrode connected to the third driving voltage wiring VIL.

The fifth transistor ST5 is turned on by an emission signal of a $k^{th}$ emission wiring ELk to connect the first electrode of the driving transistor DT to the first driving voltage wiring VDL. The fifth transistor ST5 has a gate electrode connected to the $k^{th}$ emission wiring ELk, a first electrode connected to the first driving voltage wiring VDL, and a second electrode connected to the first electrode of the driving transistor DT.

The sixth transistor ST6 is disposed between the second electrode of the driving transistor DT and the anode of the light emitting element LEL. The sixth transistor ST6 is turned on by the emission control signal of the $k^{th}$ emission wiring ELk to connect the second electrode of the driving transistor DT to the anode of the light emitting element LEL. The sixth transistor ST6 has a gate electrode connected to the $k^{th}$ emission wiring ELk, a first electrode connected to the second electrode of the driving transistor DT, and the second electrode connected to the anode of the light emitting element LEL.

When both the fifth transistor ST5 and the sixth transistor ST6 are turned on, the driving current Ids of the driving transistor DT according to the data voltage applied to the gate electrode of the driving transistor DT may flow to the light emitting element LEL.

The capacitor CST1 is formed between the gate electrode of the driving transistor DT and the first driving voltage wiring VDL. A first capacitor electrode of the capacitor CST1 may be connected to the gate electrode of the driving transistor DT, and a second capacitor electrode of the capacitor CST1 may be connected to the first driving voltage wiring VDL.

When the first electrode of each of the first through sixth transistors ST1 through ST6 and the driving transistor DT is a source electrode, the second electrode may be a drain electrode. Alternatively, when the first electrode of each of the first through sixth transistors ST1 through ST6 and the driving transistor DT is a drain electrode, the second electrode may be a source electrode.

An active layer of each of the first through sixth transistors ST1 through ST6 and the driving transistor DT may be made of any one of, for example, polysilicon, amorphous silicon, and an oxide semiconductor. Although a case in which the first through sixth transistors ST1 through ST6 and the driving transistor DT are formed as P-type metal oxide semiconductor field effect transistors (MOSFETs) has been mainly described in FIG. 5, embodiments of the present disclosure are not limited thereto. For example, according to embodiments, the first through sixth transistors ST1 through ST6 and the driving transistor DT may also be formed as N-type MOSFETs. Alternatively, according to embodiments, at least one of the first through sixth transistors ST1 through ST6 may be formed as an N-type MOSFET.

The light sensing pixel LSP according to an embodiment may be connected to an $n^{th}$ light sensing scan wiring FSLn and an $n^{th}$ sensing wiring RLn.

The light sensing pixel LSP may include a light sensing unit PDU and a sensing driving unit FDU. The light sensing unit PDU may include a light sensing element PD. The sensing driving unit FDU may include a sensing transistor SRT.

The voltage of a sensing anode of the light sensing element PD may vary according to light incident on the light sensing element PD. For example, as the amount of light incident on the light sensing element PD increases, the voltage of the sensing anode of the light sensing element PD may increase.

The light sensing element PD may be a photodiode including an anode, a PIN semiconductor layer, and a cathode. The sensing anode of the light sensing element PD may be connected to a first electrode of the sensing transistor SRT, and the cathode of the light sensing element PD may be connected to the second driving voltage wiring VSL. The PIN semiconductor layer of the light sensing element PD may include a P-type semiconductor layer connected to the anode, an N-type semiconductor layer connected to the cathode, and an I-type semiconductor layer disposed between the P-type semiconductor layer and the N-type semiconductor layer. In this case, the I-type semiconductor layer is depleted by the P-type semiconductor layer (PL) and the N-type semiconductor layer (NL) to generate an electric field in the I-type semiconductor layer, and holes and electrons generated by light are drifted by the electric field. Accordingly, the holes may be collected to the anode through the P-type semiconductor layer, and the electrons may be collected to the cathode through the N-type semiconductor layer.

The sensing transistor SRT is turned on by a sensing scan signal of the $n^{th}$ light sensing scan wiring FSLn to connect the sensing anode of the light sensing element PD to the $n^{th}$ light sensing wiring RLn. Therefore, the voltage of the sensing anode of the light sensing element PD may be applied to the $n^{th}$ light sensing wiring RLn. The sensing transistor SRT may have a gate electrode connected to the $n^{th}$ light sensing scan wiring FSLn, the first electrode connected to the sensing anode of the light sensing element PD, and a second electrode connected to the $n^{th}$ light sensing wiring RLn.

Figure 6:
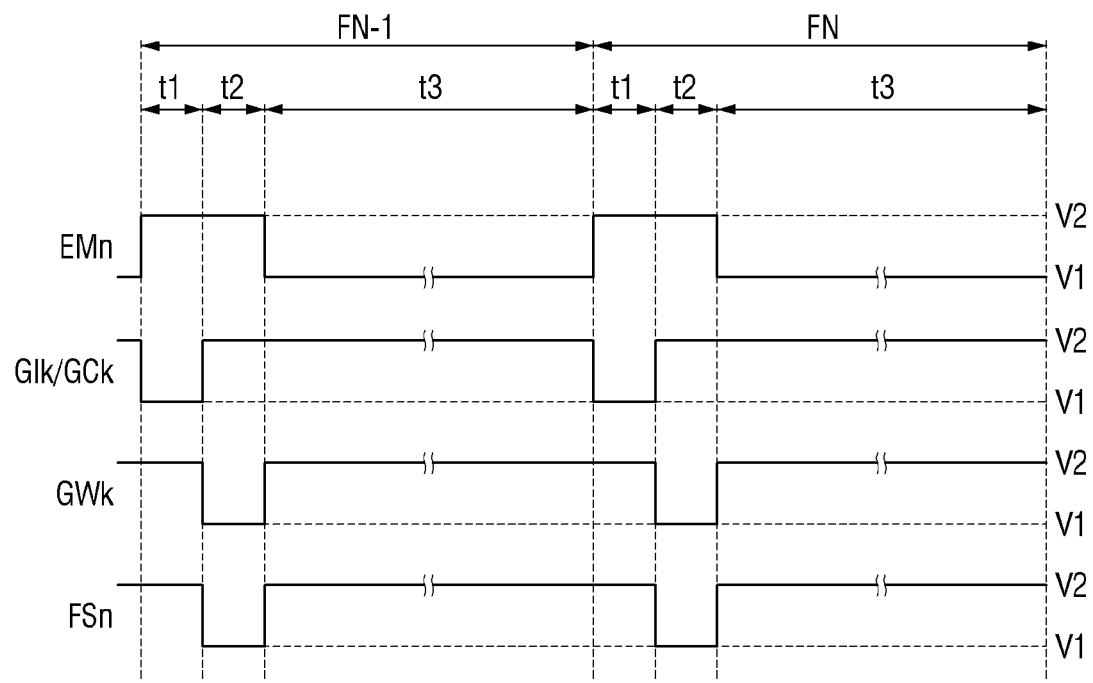
FIG. 6 is a waveform diagram of scan signals input to any one display pixel and a light sensing pixel according to an embodiment.

FIG. 6 is a waveform diagram of scan signals input to any one display pixel SP and a light sensing pixel LSP according to an embodiment.

Since a display pixel SP and a near-infrared light emitting pixel ESP are formed in the same circuit structure, the same scan signals supplied to the display pixel SP may also be supplied to the near-infrared light emitting pixel ESP.

In FIG. 6, an $n^{th}$ emission signal EMn transmitted to the $n^{th}$ emission wiring ELn during an $(N-1)^{th}$ frame period FN-1 and an $N^{th}$ frame period FN, a $k^{th}$ display initialization signal GIk transmitted to the $k^{th}$ display initialization wiring GILk, a $k^{th}$ display control signal GCk transmitted to the $k^{th}$ display control wiring GCLk, a $k^{th}$ display scan signal GWk transmitted to the $k^{th}$ display write wiring GLk, and an $n^{th}$ sensing scan signal FSn transmitted to the $n^{th}$ light sensing scan wiring FSLn are illustrated.

The $k^{th}$ display initialization signal GIk is a signal that controls on-off of the first transistor ST1 of the display pixel SP. The $k^{th}$ display control signal GCk is a signal that controls on-off of the third transistor ST3 of the display pixel SP. The $k^{th}$ display scan signal GWk is a signal that controls on-off of the second transistor ST2 and the fourth transistor ST4. The $n^{th}$ emission signal EMn is a signal that controls on-off of the fifth transistor ST5 and the sixth transistor ST6. The $n^{th}$ sensing scan signal FSn is a signal that controls on-off of the sensing transistor SRT.

Each of the $(N-1)^{th}$ frame period FN-1 and the $N^{th}$ frame period FN may include a first period t1, a second period t2, and a third period t3. The first period t1 is a period in which the gate electrode of the driving transistor DT is initialized to the third driving voltage VINT, the second period t2 is a period in which a data voltage is supplied to the gate electrode of the driving transistor DT and the threshold voltage of the driving transistor DT is sampled, and the third period t3 is a period in which the light emitting element LEL emits light according to a gate voltage of the driving transistor DT. In addition, the first period t1 and the third period t3 are periods in which the light sensing element PD is exposed to light, and the second period t2 is a period in which an anode voltage of the light sensing element PD is sensed.

The $k^{th}$ emission signal EMn has a first-level voltage V1 during the third period t3 and a second-level voltage V2 during the first period t1 and the second period t2. The $k^{th}$ display scan signal GWk has the first-level voltage V1 during the second period t2 and the second-level voltage V2 during the first period t1 and the third period t3.

The $k^{th}$ display initialization signal GIk and the $k^{th}$ display control signal GCk have the first-level voltage V1 during the first period t1 and have the second-level voltage V2 during the second period t2 and the third period t3. That is, the $k^{th}$ display initialization signal GIk and the $k^{th}$ display control signal GCk may be substantially the same.

The $n^{th}$ sensing scan signal FSn has the first-level voltage V1 during the second period t2 and the second-level voltage V2 during the first period t1 and the third period t3. The $n^{th}$ sensing scan signal FSn may be substantially the same as the $k^{th}$ display initialization signal GWk.

Each of the first period t1 and the second period t2 may be one horizontal period. One horizontal period refers to a period in which a data voltage is supplied to each of the display pixels SP disposed in one horizontal line of the display panel 100. Therefore, one horizontal period may be defined as one horizontal line scan period. The display pixels SP arranged in one horizontal line may be defined as subpixels connected to one display initialization wiring, one display write wiring, one display control wiring, and one emission wiring.

The first-level voltage V1 may be a turn-on voltage that can turn on the first through sixth transistors ST1 through ST6 and the sensing transistor SRT. The second-level voltage V2 may be a turn-off voltage that can turn off the first through sixth transistors ST1 through ST6 and the sensing transistor SRT. The second-level voltage V2 may have a higher level than the first-level voltage V1.

The operation of the display pixel SP during the first period t1, the second period t2, and the third period t3 will now be described with reference to FIGS. 5 and 6.

First, in the first period t1, the $k^{th}$ display initialization signal GIk having the first-level voltage V1 is supplied to the $k^{th}$ display initialization wiring GILk, and the $k^{th}$ display control signal GCk having the first-level voltage V1 is supplied to the $k^{th}$ display control wiring GCLk.

During the first period t1, the first transistor ST1 is turned on by the $k^{th}$ display initialization signal GIk having the first-level voltage V1. Due to the turn-on of the first transistor ST1, the third driving voltage VINT of the third driving voltage wiring VIL is applied to the gate electrode of the driving transistor DT. When the initialization voltage is applied to the gate electrode of the driving transistor DT during the first period t1, the voltage Vsg between the first electrode and the gate electrode of the driving transistor DT is greater than the threshold voltage Vth of the driving transistor DT. Accordingly, the driving transistor DT may be turned on. That is, since an on-bias can be applied to the driving transistor DT, hysteresis characteristics of the driving transistor DT can be improved.

In addition, during the first period t1, the fourth transistor ST4 is turned on by the $k^{th}$ display control signal GCk having the first-level voltage V1. Therefore, due to the turn-on of the fourth transistor ST4 during the first period t1, the anode of the light emitting element LEL may be initialized to the third driving voltage VINT of the third driving voltage wiring VIL.

Second, the $k^{th}$ display scan signal GWk having the first-level voltage V1 is supplied to the $k^{th}$ display write wiring GWLk during the second period t2. Therefore, during the second period t2, each of the second transistor ST2 and the third transistor ST3 is turned on by the $k^{th}$ display scan signal GWk having the first-level voltage V1.

During the second period t2, the gate electrode and the second electrode of the driving transistor DT are connected to each other due to the turn-on of the third transistor ST3, and the driving transistor DT operates as a diode. In addition, due to the turn-on of the second transistor ST2 during the second period t2, a data voltage Vdata is supplied to the first electrode of the driving transistor DT. In this case, since the voltage (Vsg=Vdata−VINT) between the first electrode and the gate electrode of the driving transistor DT is smaller than the threshold voltage Vth, the driving transistor DT forms a current path until the voltage Vsg between the first electrode and the gate electrode reaches the threshold voltage Vth. Accordingly, during the second period t2, the gate electrode and the second electrode of the driving transistor DT rise to a difference voltage (Vdata−Vth) between the data voltage Vdata and the threshold voltage Vth of the driving transistor DT.

Third, the $k^{th}$ emission signal EMk having the first-level voltage V1 is supplied to the $k^{th}$ emission wiring ELk during the third period t3. During the third period t3, each of the fifth transistor ST5 and the sixth transistor ST6 is turned on by the $k^{th}$ emission signal EMk having the first-level voltage V1.

Due to the turn-on of the fifth transistor ST5, the first electrode of the driving transistor DT is connected to the first driving voltage wiring VDL. Due to the turn-on of the sixth transistor ST6, the second electrode of the driving transistor DT is connected to the anode of the light emitting element LEL.

When the fifth transistor ST5 and the sixth transistor ST6 are turned on, the driving current Ids flowing according to the voltage of the gate electrode of the driving transistor DT may be supplied to the light emitting element LEL. The driving current Ids may be defined as in Equation 2.

$$Ids=k'\times\{VDD-(Vdata-Vth)-Vth\} \quad (2).$$

In Equation 2, $k'^{th}$ is a proportional coefficient determined by the structure and physical characteristics of the driving transistor DT, Vth is a threshold voltage of the driving transistor DT, VDD is a first driving voltage of the first driving voltage wiring VDL, and Vdata is a data voltage. The voltage of the gate electrode of the driving transistor DT is (Vdata−Vth), and the voltage of the first electrode is VDD. Equation 2 is rearranged into Equation 3.

$$Ids=k'\times(VDD-Vdata)^2 \quad (3)$$

Ultimately, the driving current Ids does not depend on the threshold voltage Vth of the driving transistor DT as shown in Equation 3. That is, the threshold voltage Vth of the driving transistor DT may be compensated.

The operation of the light sensing pixel LSP during the first period t1, the second period t2, and the third period t3 will now be described with reference to FIGS. 5 and 6.

First, the sensing transistor SRT is maintained in a reset state, and the light sensing element PD receives reflected light incident from the front side.

Second, the $n^{th}$ sensing scan signal FSn having the first-level voltage V1 is supplied to the $n^{th}$ light sensing scan wiring FSLn during the first period t1. The sensing transistor SRT is turned on by the $n^{th}$ sensing scan signal FSn having the first-level voltage V1. Due to the turn-on of the sensing transistor SRT, the sensing anode of the light sensing element PD may be connected to the $n^{th}$ light sensing wiring RLn. Therefore, the component detection circuit 400 may sense the voltage of the sensing anode of the light sensing element PD through the $n^{th}$ light sensing wiring RLn.

Third, the $n^{th}$ sensing scan signal FSn having the second-level voltage V2 is supplied to the $n^{th}$ light sensing scan wiring FSLn during the second period t2 and the third period t3. Therefore, the sensing transistor SRT may be turned off during the second period t2 and the third period t3. Accordingly, the voltage of the sensing anode of the light sensing element PD may increase according to light incident during the second period t2 and the third period t3. For example, as the amount of light incident on the light sensing element PD increases, the voltage of the sensing anode of the light sensing element PD may increase.

Figure 7:
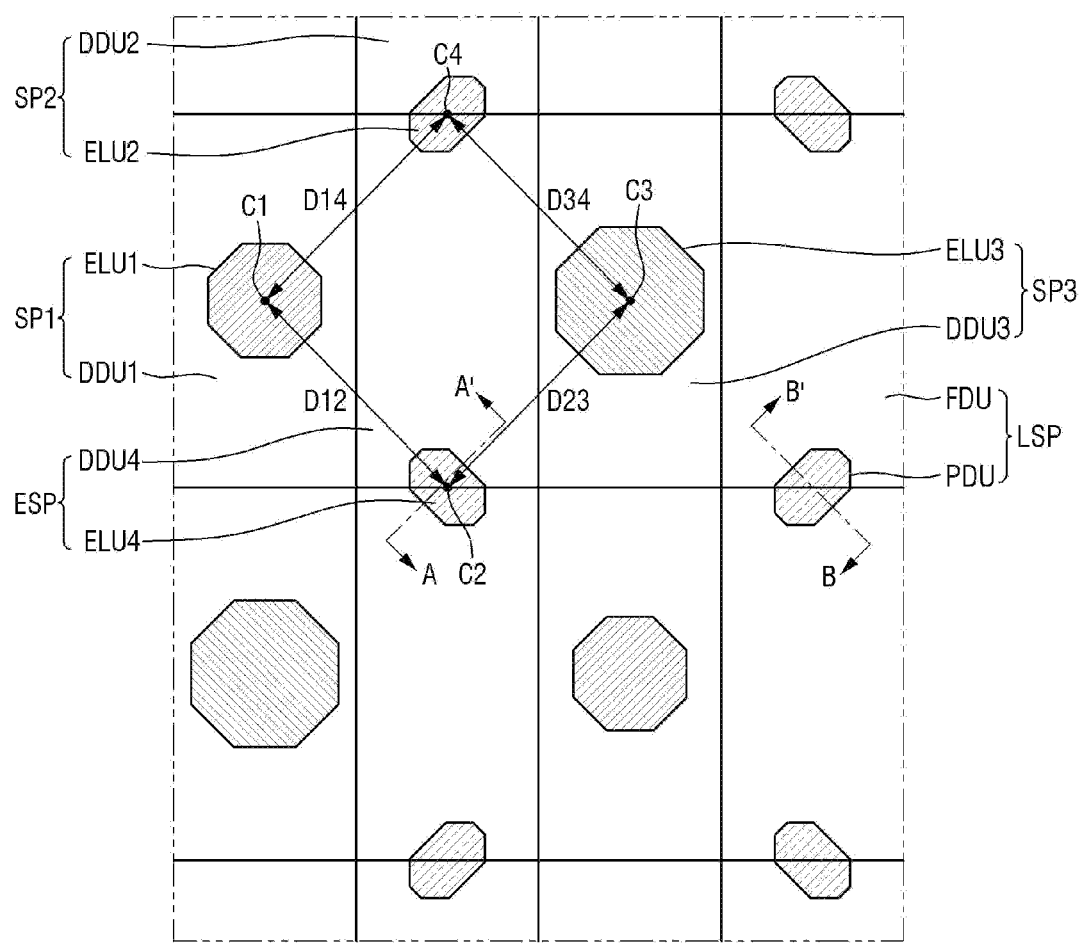
FIG. 7 is a layout view of a portion of a display area according to an embodiment.

FIG. 7 is a layout view of a portion of the display area DA according to an embodiment.

Referring to FIG. 7, a first unit pixel USP1 including first through third display pixels SP1 through SP3 and a near-infrared light emitting pixel ESP, and a second unit pixel USP2 including the first through third display pixels SP1 through SP3 and a light sensing pixel LSP may be alternately arranged in the display area DA.

In other words, the first display pixel SP1, the second display pixel SP2, the third display pixel SP3, and the near-infrared light emitting pixel ESP may be defined as the first unit pixel USP1. In addition, the first display pixel SP1, the second display pixel SP2, the third display pixel SP3, and the light sensing pixel LSP may be defined as the second unit pixel USP2. Each of the first and second unit pixels USP1 and USP2 may be defined as a minimum unit of subpixels that can display white while emitting near-infrared light or sensing reflected light incident from the front side.

The first display pixel SP1 of the first unit pixel USP1 may include a first light emitting unit ELU1 that emits first light and a first pixel driving unit DDU1 that supplies a driving current to a light emitting element of the first light emitting unit ELU1. The first light may be light of a red wavelength band. For example, a main peak wavelength of the first light may be located at about 600 nm to about 750 nm.

The second display pixel SP2 may include a second light emitting unit ELU2 that emits second light and a second pixel driving unit DDU2 that supplies a driving current to a light emitting element of the second light emitting unit ELU2. The second light may be light of a green wavelength band. For example, a main peak wavelength of the second light may be located at about 480 nm to about 560 nm.

The third display pixel SP3 may include a third light emitting unit ELU3 that emits third light and a third pixel driving unit DDU3 that supplies a driving current to a light emitting element of the third light emitting unit ELU3. The third light may be light of a blue wavelength band. For example, a main peak wavelength of the third light may be located at about 370 nm to about 460 nm.

The near-infrared light emitting pixel ESP may include a fourth light emitting unit ELU4 that emits near-infrared light and a fourth pixel driving unit DDU4 that supplies a driving current to a light emitting element of the fourth light emitting unit ELU4. The near-infrared light emitted from the fourth light emitting unit ELU4 may be light in a wavelength band of about 750 nm to about 900 nm. Alternatively, the fourth light emitting unit ELU4 may emit the third light in the blue wavelength band (e.g., about 370 nm to about 460 nm), like the third light emitting unit ELU3 of the third display pixel SP3. When the fourth light emitting unit ELU4 emits light in the blue wavelength band, a wavelength conversion layer may be further formed on a front surface (or upper surface) of the fourth light emitting unit ELU4 to shift the light in the blue wavelength band to light in a near-infrared wavelength band and output the light in the near-infrared wavelength band.

The detailed structure of the first through third display pixels SP1 through SP3 of the second unit pixel USP2 is substantially the same as the detailed structure of the first through third display pixels SP1 through SP3 of the first unit pixel USP1. However, the second unit pixel USP2 includes the light sensing pixel LSP instead of the near-infrared light emitting pixel ESP, and the light sensing pixel LSP includes a light sensing unit PDU and a sensing driving unit FDU.

In the first unit pixel USP1, the first pixel driving unit DDU1 and the third pixel driving unit DDU3 may be disposed in the first direction DR1, and the second pixel driving unit DDU2 and the near-infrared light emitting pixel ESP may be disposed in the second direction DR2. In the second unit display pixel USP2, the first pixel driving unit DDU1 and the third pixel driving unit DDU3 may be disposed in the first direction DR1, and the light sensing pixel LSP and the second pixel driving unit DDU2 may be disposed in the second direction DR2.

As illustrated in FIG. 7, the first light emitting unit ELU1, the second light emitting unit ELU2, the third light emitting unit ELU3, the fourth light emitting unit ELU4, and the light sensing unit PDU may have an octagonal planar shape. However, embodiments of the present disclosure are not limited thereto. For example, according to embodiments, the first light emitting unit ELU1, the second light emitting unit ELU2, the third light emitting unit ELU3, the fourth light emitting unit ELU4, and the light sensing unit PDU may have a quadrilateral planar shape such as, for example, a rhombus, or a polygonal planar shape other than a quadrilateral and an octagon.

Due to the placement positions and planar shapes of the first light emitting unit ELU1, the second light emitting unit ELU2, the third light emitting unit ELU3, and the fourth light emitting unit ELU4 (or the light sensing unit PDU), a distance D12 between a center C1 of the first light emitting unit ELU1 and a center C2 of the second light emitting unit ELU2 neighboring each other, a distance D23 between the center C2 of the second light emitting unit ELU2 and a center C3 of the third light emitting unit ELU3 neighboring each other, a distance D14 between the center C1 of the first light emitting unit ELU1 and a center C4 of the fourth light emitting unit ELU4 (or the light sensing unit PDU) neighboring each other, and a distance D34 between the center C3 of the third light emitting unit ELU3 and the center C4 of the fourth light emitting unit ELU4 (or the light sensing unit PDU) neighboring each other may be substantially the same.

Figure 8:
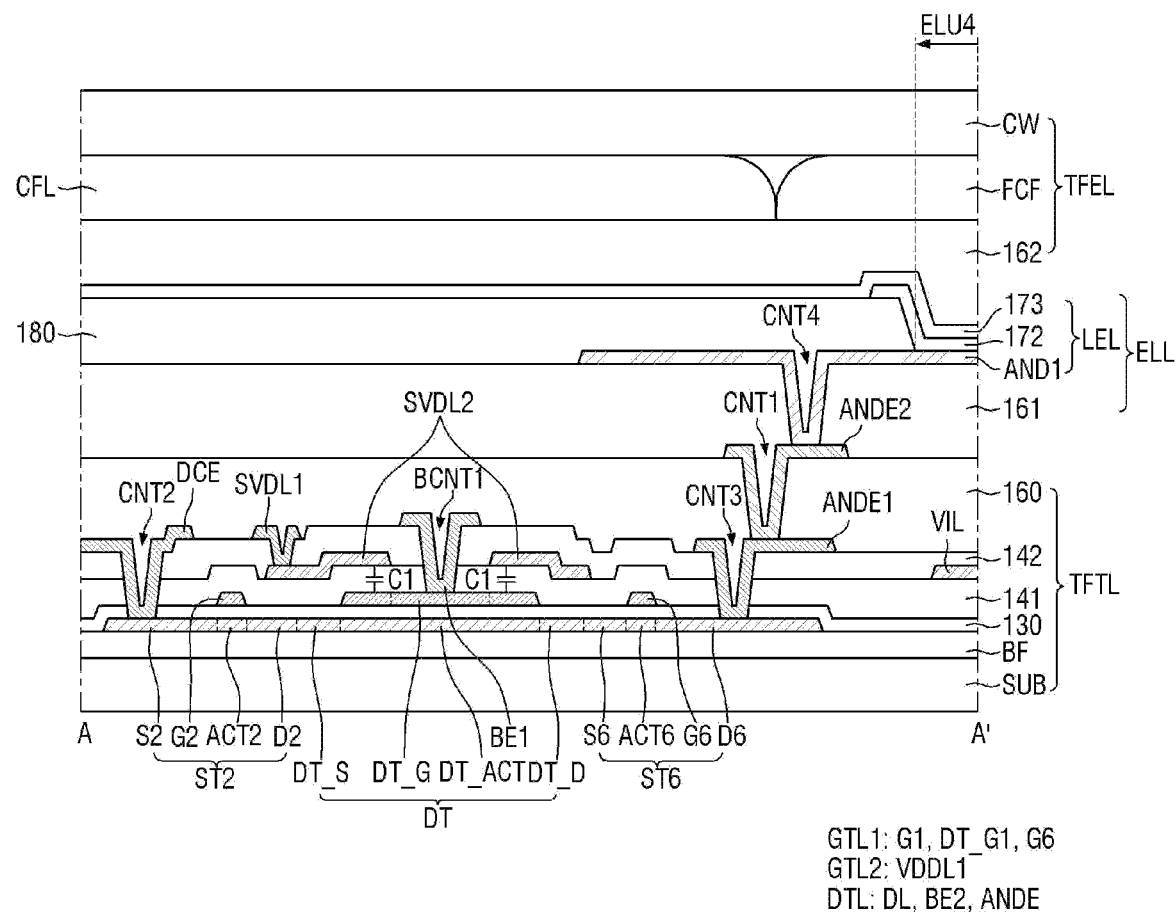
FIG. 8 is a cross-sectional view of the display panel taken along line A-A' of FIG. 7.

FIG. 8 is a cross-sectional view of the display panel 100 taken along line A-A' of FIG. 7 according to an embodiment. For example, FIG. 8 is a cross-sectional view illustrating a portion of a cross-section of the fourth light emitting unit ELU4 and the fourth pixel driving unit DDU4 of a near-infrared light emitting pixel ESP.

Referring to FIG. 8, a thin-film transistor layer TFTL, a light emitting element layer ELL, and an encapsulation layer TFEL may be sequentially formed on a substrate SUB.

The thin-film transistor layer TFTL may be a layer in which the driving transistor DT, the first through sixth transistors ST1 through ST6, and the capacitor CST1 of each of the first pixel driving unit DDU1, the second pixel driving unit DDU2, the third pixel driving unit DDU3, and the fourth pixel driving unit DDU4 are formed. The thin-film transistor layer TFTL includes a light blocking layer, an active layer ACT, a first gate layer GTL1, a second gate layer GTL2, a first data metal layer DTL1, a second data metal layer DTL2, a buffer layer BF, a gate insulating layer 130, a first interlayer insulating layer 141, a second interlayer insulating layer 142, a first organic layer 160, and a second organic layer 161.

The buffer layer BF may be formed on a surface of the substrate SUB. The buffer layer BF may protect thin-film transistors and an organic light emitting layer 172 of each light emitting element LEL from, for example, moisture introduced through the substrate SUB, which may be vulnerable to moisture penetration. The buffer layer BF may be composed of a plurality of inorganic layers stacked alternately. For example, the buffer layer BF may be a multilayer in which one or more inorganic layers including, for example, a silicon nitride layer, a silicon oxynitride layer, a silicon oxide layer, a titanium oxide layer, and an aluminum oxide layer are alternately stacked. The buffer layer BF may be omitted according to embodiments.

The active layer ACT may be formed on the buffer layer BF. The active layer ACT may include, for example, polycrystalline silicon, monocrystalline silicon, low-temperature polycrystalline silicon, amorphous silicon, or an oxide semiconductor.

The active layer ACT may include a channel region DT_ACT, a source electrode DT_S, and a drain electrode DT_D of the driving transistor DT. The channel region DT_ACT may be a region overlapping a gate electrode DT_G of the driving transistor DT in the third direction DR3, which is a thickness direction of the substrate SUB. The source electrode DT_S may be disposed on a side of the channel region DT_ACT, and the drain electrode DT_D may be disposed on the other side of the channel region DT_ACT. The source electrode DT_S and the drain electrode DT_D may be regions not overlapping the gate electrode DT_G in the third direction DR3. The source electrode DT_S and the drain electrode DT_D may be regions formed to have conductivity by doping a silicon semiconductor or an oxide semiconductor with ions or impurities.

In addition, the active layer ACT may include channel regions ACT1 through ACT6, source electrodes S1 through S6, and drain electrodes D1 through D6 of the first through sixth transistors ST1 through ST6. Each of the channel regions ACT1 through ACT6 of the first through sixth transistors ST1 through ST6 may overlap a corresponding gate electrode among the gate electrodes G1 through G6 in the third direction DR3.

The source electrodes S1 through S6 and the drain electrodes D1 through D6 of the first through sixth transistors ST1 through ST6 may be regions formed to have conductivity by doping a silicon semiconductor or an oxide semiconductor with ions or impurities.

The gate insulating layer 130 may be formed on the active layer ACT. The gate insulating layer 130 may be made of an inorganic layer, for example, a silicon nitride layer, a silicon oxynitride layer, a silicon oxide layer, a titanium oxide layer, or an aluminum oxide layer.

The first gate layer GTL1 may be formed on the gate insulating layer 130. The first gate layer GTL1 may include the gate electrode DT_G of the driving transistor DT. In addition, the first gate layer GTL1 may include the gate electrodes G1 through G6 of the first through sixth switching transistors ST1 through ST6, display write wirings GLk and GWLk+1, display initialization wirings GILk and GILk+1, display control wirings GCLk and GCLk+1, and emission wirings ELk and ELk+1. The first gate layer GTL1 may be a single layer or a multilayer made of any one or more of, for example, molybdenum (Mo), aluminum (Al), chromium (Cr), gold (Au), titanium (Ti), nickel (Ni), neodymium (Nd), copper (Cu), and alloys thereof.

The first interlayer insulating layer 141 may be formed on the first gate layer GTL1. The first interlayer insulating layer 141 may be made of an inorganic layer, for example, a silicon nitride layer, a silicon oxynitride layer, a silicon oxide layer, a titanium oxide layer, or an aluminum oxide layer. The first interlayer insulating layer 141 may include a plurality of inorganic layers.

The second gate layer GTL2 may be formed on the first interlayer insulating layer 141. The second gate layer GTL2 may include the third driving voltage wiring VIL and a second sub-driving voltage wiring SVDL2. The second gate layer GTL2 may be a single layer or a multilayer made of any one or more of, for example, molybdenum (Mo), aluminum (Al), chromium (Cr), gold (Au), titanium (Ti), nickel (Ni), neodymium (Nd), copper (Cu), and alloys thereof.

The second interlayer insulating layer 142 may be formed on the second gate layer GTL2. The second interlayer insulating layer 142 may be made of an inorganic layer, for example, a silicon nitride layer, a silicon oxynitride layer, a silicon oxide layer, a titanium oxide layer, or an aluminum oxide layer. The second interlayer insulating layer 142 may include a plurality of inorganic layers.

The first data metal layer may be formed on the second interlayer insulating layer 142.

The first data metal layer may include a first sub-driving voltage wiring SVDL1, a first connection electrode BE1, a second connection electrode VIE, and a first anode connection electrode ANDE1. The first data metal layer DTL1 may be a single layer or a multilayer made of any one or more of, for example, molybdenum (Mo), aluminum (Al), chromium (Cr), gold (Au), titanium (Ti), nickel (Ni), neodymium (Nd), copper (Cu), and alloys thereof.

The first organic layer 160 may be formed on the first data metal layer to flatten steps formed by the active layer ACT, the first gate layer GTL1, the second gate layer GTL2, and the first data metal layer. The first organic layer 160 may be made of an organic layer such as, for example, acryl resin, epoxy resin, phenolic resin, polyamide resin, or polyimide resin.

The second data metal layer may be formed on the first organic layer 160. The second data metal layer may include a second anode connection electrode ANDE2 and light sensing wirings ERL connected to the second anode connection electrode ANDE2. The second data metal layer DTL2 may be a single layer or a multilayer made of any one or more of, for example, molybdenum (Mo), aluminum (Al), chromium (Cr), gold (Au), titanium (Ti), nickel (Ni), neodymium (Nd), copper (Cu), and alloys thereof.

The second organic layer 161 may be formed on the second data metal layer including the second anode connection electrode ANDE2 to flatten steps. The second organic layer 161 may be made of an organic layer such as, for example, acryl resin, epoxy resin, phenolic resin, polyamide resin, or polyimide resin.

A first connection contact hole BCNT1 may be a hole penetrating the first interlayer insulating layer 141 and the second interlayer insulating layer 142 to expose the gate electrode DT_G of the driving transistor DT. The first connection electrode BE1 may be connected to the gate electrode DT_G of the driving transistor DT through the first connection contact hole BCNT1.

A first contact hole CNT1 may be a hole penetrating the first organic layer 160 to expose the first anode connection electrode ANDE1. The second anode connection electrode ANDE2 may be connected to the first anode connection electrode ANDE1 through a first anode contact hole AND_CNT1 (the first contact hole CNT1).

A second contact hole CNT2 may be a hole penetrating the gate insulating layer 130, the first interlayer insulating layer 141, and the second interlayer insulating layer 142 to expose the second electrode D2 of the second transistor ST2. Each data wiring DLn may be connected to the second electrode D2 of the second transistor ST2 through a third contact hole CNT3.

A third contact hole CNT3 may be a hole penetrating the gate insulating layer 130, the first interlayer insulating layer 141, and the second interlayer insulating layer 142 to expose the second electrode D6 of the sixth transistor ST6. The first anode connection electrode ANDE1 may be connected to the second electrode D6 of the sixth transistor ST6 through the third contact hole CNT3.

A fourth contact hole CNT4 may be a hole penetrating the second organic layer 161 to expose the second anode connection electrode ANDE2.

The light emitting element layer ELL including light sensing elements PD and light emitting elements LEL is formed on the thin-film transistor layer TFTL. Banks 180 may be formed between the light emitting elements LEL, and the light emitting elements LEL may be formed on the same layer as the light sensing elements PD. The light emitting elements LEL, the light sensing elements PD, and the banks 180 are formed on the second organic layer 161.

Each of the light emitting elements LEL may include an anode AND1, the organic light emitting layer 172, and a cathode 173. The anode AND1 may be made of a metal material having high reflectivity, such as, for example, a stacked structure (Ti/Al/Ti) of aluminum and titanium, a stacked structure (ITO/Al/ITO) of aluminum and indium tin oxide, an APC alloy, or a stacked structure (ITO/APC/ITO) of an APC alloy and indium tin oxide. The APC alloy is an alloy of silver (Ag), palladium (Pd), and copper (Cu).

The banks 180 may be formed on the second organic layer 161 to separate the anodes AND1 so as to define emission areas of the first through third display pixels SP1 through SP3 and the near-infrared light emitting pixel ESP. The banks 180 may be formed to cover edges of the anodes AND1. The banks 180 may be made of an organic layer such as, for example, acryl resin, epoxy resin, phenolic resin, polyamide resin, or polyimide resin.

Each of the emission areas of the first through third display pixels SP1 through SP3 and the near-infrared light emitting pixel ESP is an area in which the anode AND1, the organic light emitting layer 172, and the cathode 173 are sequentially stacked so that holes from the anode AND1 and electrons from the cathode 173 are recombined in the organic light emitting layer 172 to emit light.

The organic light emitting layer 172 is formed on each anode AND1 and the banks 180. The organic light emitting layer 172 may include an organic material to emit light of a predetermined color. For example, the organic light emitting layer 172 may include a hole transporting layer, an organic material layer, and an electron transporting layer.

A third organic layer 162 for planarization is formed on the light emitting elements LEL and the banks 180, and the encapsulation layer TFEL is formed on the third organic layer 162 to protect the third organic layer 162, the light emitting elements LEL, the banks 180, and the light sensing unit PDU.

For example, a color filter layer CFL is formed on front surfaces of the light emitting elements LEL of the first through third display pixels SP1 through SP3. In addition, a wavelength conversion layer FCF may be further formed on the fourth light emitting unit ELU4 of the near-infrared light emitting pixel ESP to shift a wavelength band of light emitted from a light emitting element LEL to a near-infrared wavelength band and output light in the near-infrared wavelength band. A cover window CW is formed on a front surface of the display panel 100 including the color filter layer CFL and the wavelength conversion layer FCF.

Figure 9:
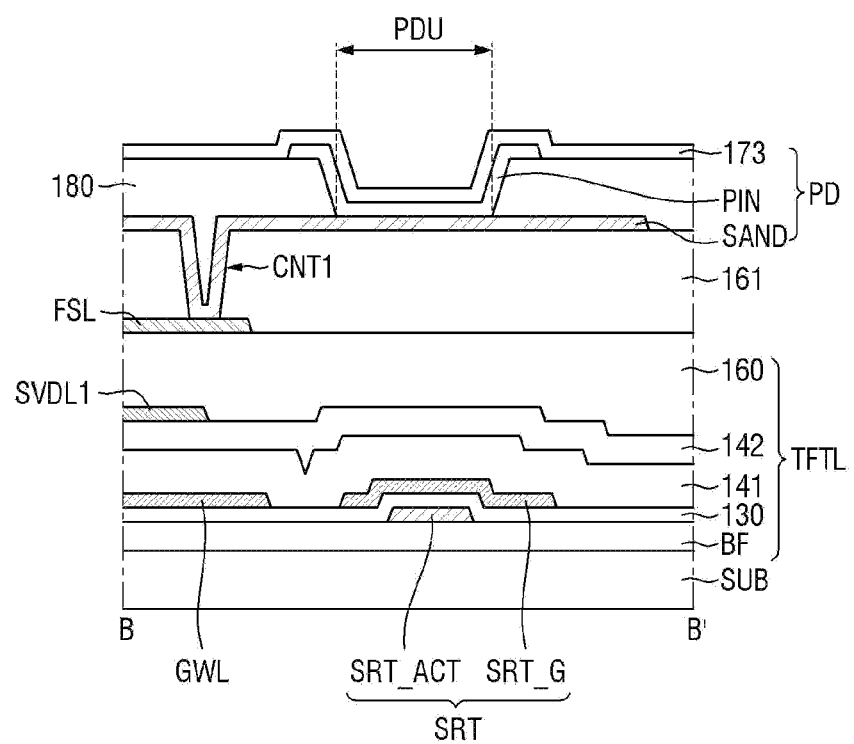
FIG. 9 is a cross-sectional view of the display panel taken along line B-B' of FIG. 7 according to an embodiment.

FIG. 9 is a cross-sectional view of the display panel 100 taken along line B-B' of FIG. 7 according to an embodiment. For example, FIG. 9 is a cross-sectional view illustrating a portion of a cross-section of the light sensing unit PDU and the sensing driving unit FDU.

Referring to FIG. 9, the thin-film transistor layer TFTL including the sensing transistor SRT may be formed on the substrate SUB, and the light sensing element PD may be formed on the thin-film transistor layer TFTL.

The thin-film transistor layer TFTL on a front surface of the substrate SUB includes the sensing transistor SRT, the gate insulating layer 130, the first interlayer insulating layer 141, the second interlayer insulating layer 142, the first organic layer 160, and the second organic layer 161.

For example, the buffer layer BF may be formed on a surface of the substrate SUB. The buffer layer BF may protect the sensing transistor SRT from, for example, moisture introduced through the substrate SUB, which may be vulnerable to moisture penetration. The buffer layer BF may be composed of a plurality of inorganic layers stacked alternately.

An active layer SRT_ACT may be formed on the buffer layer BF as a channel region of the sensing transistor SRT. The gate insulating layer 130 may be formed on the active layer SRT_ACT.

A gate layer SRT_G of the sensing transistor SRT and a separate display write wiring GWL may be formed on the gate insulating layer 130. Each of the gate layer SRT_G of the sensing transistor SRT and the display write wiring GWL may be a single layer or a multilayer made of any one or more of, for example, molybdenum (Mo), aluminum (Al), chromium (Cr), gold (Au), titanium (Ti), nickel (Ni), neodymium (Nd), copper (Cu), and alloys thereof.

The first interlayer insulating layer 141 may be formed on the gate insulating layer 130 as well as the sensing transistor SRT.

Wirings such as, for example, a display initialization wiring GIL and a display control wiring GCL may be formed on the first interlayer insulating layer 141. In addition, the second interlayer insulating layer 142 may be further formed on the first interlayer insulating layer 141 as well as the wirings.

The display control wiring GCL or the display initialization wiring GIL may also be formed on the second interlayer insulating layer 142 as a single layer or a multilayer made of any one or more of, for example, molybdenum (Mo), aluminum (Al), chromium (Cr), gold (Au), titanium (Ti), nickel (Ni), neodymium (Nd), copper (Cu), and alloys thereof.

The first organic layer 160 may be formed on the second interlayer insulating layer 142 to flatten steps formed by wirings such as the sensing transistor SRT and the display write wiring GWL. As described above, the first organic layer 160 may be made of an organic layer such as, for example, acryl resin, epoxy resin, phenolic resin, polyamide resin, or polyimide resin.

The light sensing element PD is formed on the first organic layer 160. To this end, a light sensing scan wiring FSL may be formed on the first organic layer 160. The light sensing scan wiring FSL may be a single layer or a multilayer made of any one or more of, for example, molybdenum (Mo), aluminum (Al), chromium (Cr), gold (Au), titanium (Ti), nickel (Ni), neodymium (Nd), copper (Cu), and alloys thereof.

The second organic layer 161 may be formed on the first organic layer 160 as well as the light sensing scan wiring FSL. As described above, the first contact hole CNT1 that exposes the light sensing scan wiring FSL is formed in the second organic layer 161. The light sensing element PD may be connected to the light sensing scan wiring FSL or an anode voltage supply wiring through a sensing anode SAND passing through the first contact hole CNT1. The light sensing element PD may include the sensing anode SAND, a PIN semiconductor layer PIN, and the cathode 173. Here, the PIN semiconductor layer PIN may be electrically connected to the sensing anode SAND.

The PIN semiconductor layer may include a P-type semiconductor layer connected to the sensing anode SAND, an N-type semiconductor layer connected to the cathode 173, and an I-type semiconductor layer disposed between the P-type semiconductor layer and the N-type semiconductor layer. In this case, the I-type semiconductor layer is depleted by the P-type semiconductor layer and the N-type semiconductor layer to generate an electric field in the I-type semiconductor layer, and holes and electrons generated by light are drifted by the electric field. Accordingly, the holes may be collected to the anode through the P-type semiconductor layer, and the electrons may be collected to the cathode through the N-type semiconductor layer.

Figure 10:
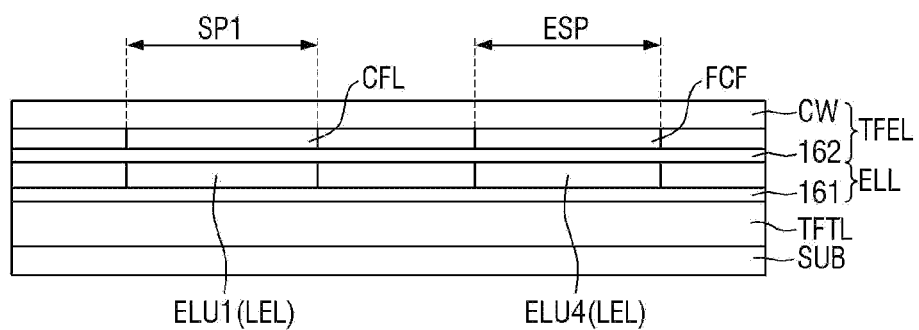
FIG. 10 is a cross-sectional view of an embodiment of the present disclosure, schematically illustrating the cross-sectional structure of a first display pixel and a near-infrared light emitting pixel illustrated in FIG. 7.

FIG. 10 is a cross-sectional view of an embodiment of the present disclosure, schematically illustrating the cross-sectional structure of a first display pixel SP1 and a near-infrared light emitting pixel ESP illustrated in FIG. 7.

Referring to FIG. 10, a thin-film transistor layer TFTL including a first pixel driving unit DDU1 and a fourth pixel driving unit DDU4, a light emitting element layer ELL including a second organic layer 161, light emitting elements LEL and banks 180, and an encapsulation layer TFEL including a color filter layer CFL, a wavelength conversion layer FCF and a cover window CW may be sequentially formed on a substrate SUB to form each first display pixel SP1 and each near-infrared light emitting pixel ESP.

The light emitting element LEL included in each near-infrared light emitting pixel ESP may emit light in a blue wavelength band (e.g., about 370 nm to about 460 M). To this end, the light emitting elements LEL of the near-infrared light emitting pixels ESP, that is, organic light emitting layers of the light emitting elements LEL, may include at least one organic material including, for example, copper phthalocyanine (CuPc), N,N'-Di(naphthalene-1-yl)-N,N'-diphenyl-benzidine (NPB), and tris-8-hydroxyquinoline aluminum (Alq3).

When the light emitting elements LEL of the near-infrared light emitting pixels ESP emit light in the blue wavelength band as described above, the wavelength conversion layer FCF may be further formed on front surfaces (or upper surfaces) of the near-infrared light emitting pixels ESP to shift the light in the blue wavelength band to light in a near-infrared wavelength band (e.g., about 750 nm to about 900 nm) and output the light in the near-infrared wavelength band. To this end, the wavelength conversion layer FCF may include at least one quantum dot film or night shift filter.

Figure 11:
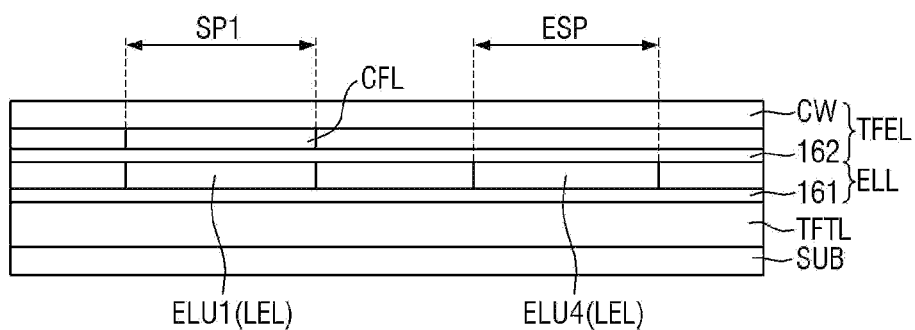
FIG. 11 is a cross-sectional view of an embodiment of the present disclosure, schematically illustrating the cross-sectional structure of a first display pixel and a near-infrared light emitting pixel illustrated in FIG. 7.

FIG. 11 is a cross-sectional view of an embodiment of the present disclosure, schematically illustrating the cross-sectional structure of a first display pixel SP1 and a near-infrared light emitting pixel ESP illustrated in FIG. 7.

Referring to FIG. 11, a light emitting element layer ELL including light emitting elements LEL and banks 180 may be formed on a thin-film transistor layer TFTL, and an encapsulation layer TFEL including a color filter layer CFL and a cover window CW may be formed on the light emitting element layer ELL to form each first display pixel SP1 and each near-infrared light emitting pixel ESP.

The light emitting element LEL included in each near-infrared light emitting pixel ESP may emit light in a near-infrared wavelength band (e.g., about 750 nm to about 900 nm). To this end, the light emitting elements LEL of the near-infrared light emitting pixels ESP, that is, organic light emitting layers of the light emitting elements LEL, may include at least one organic material including, for example, a low molecular weight boron-dipyrromethene derivative (BODIPY-Ph), acetone including a low molecular weight boron-dipyrromethene derivative (BODIPY-Ph), hydrocarbon (e.g., rubrene), N,N'-Di(naphthalen-1-yl)-N,N'-diphenyl-benzidine (NPB), and tris-8-hydroxyquinoline aluminum (Alq3). When the light emitting elements LEL of the near-infrared light emitting pixels ESP emit light in the near-infrared wavelength band as described above, front surfaces (or upper surfaces) of the near-infrared light emitting pixels ESP may be formed to be transparent. That is, according to embodiments of the present disclosure, there is no need to form openings or color filters on the front surfaces of the near-infrared light emitting pixels ESP.

Figure 12:
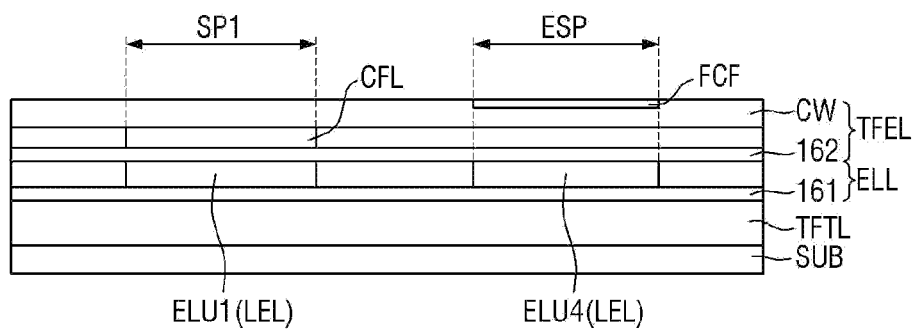
FIG. 12 is a cross-sectional view of an embodiment of the present disclosure, schematically illustrating the cross-sectional structure of a first display pixel and a near-infrared light emitting pixel illustrated in FIG. 7.

FIG. 12 is a cross-sectional view of an embodiment of the present application, schematically illustrating the cross-sectional structure of a first display pixel SP1 and a near-infrared light emitting pixel ESP illustrated in FIG. 7.

Referring to FIG. 12, a light emitting element layer ELL including light emitting elements LEL and banks 180 may be formed on a thin-film transistor layer TFTL, and an encapsulation layer TFEL including a color filter layer CFL and a cover window CW may be formed on the light emitting element layer ELL to form each first display pixel SP1 and each near-infrared light emitting pixel ESP.

The light emitting element LEL included in each near-infrared light emitting pixel ESP may emit light in a blue wavelength band (e.g., about 370 nm to about 460 nm). When the light emitting elements LEL of the near-infrared light emitting pixels ESP emit light in the blue wavelength band as described above, a wavelength conversion layer FCF may be further formed on front surfaces (or upper surfaces) of the near-infrared light emitting pixels ESP to shift light in the blue wavelength band to light in a near-infrared wavelength band (e.g., about 750 to about 900 nm) and output the light in the near-infrared wavelength band.

The wavelength conversion layer FCF may be formed on a front surface or a rear surface of the cover window CW to correspond to the placement position and area of each of the near-infrared light emitting pixels ESP. Here, the wavelength conversion layer FCF may be formed integrally with the cover window CW or may be attached to the cover window CW. Each wavelength conversion layer FCF may include at least one quantum dot film or night shift filter.

Figure 13:
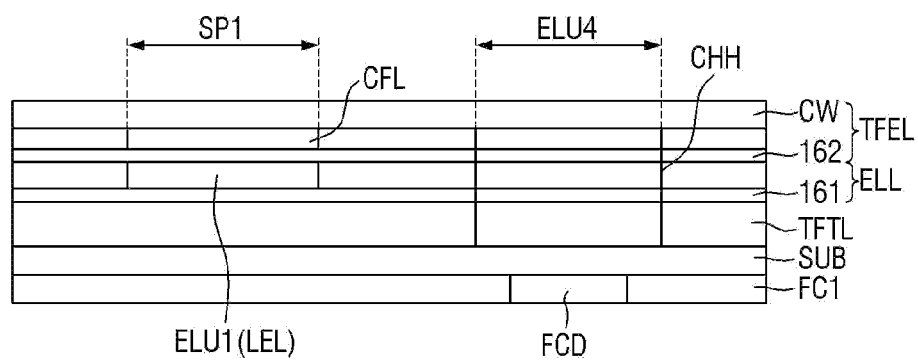
FIG. 13 is a cross-sectional view of an embodiment of the present disclosure, schematically illustrating the cross-sectional structure of a first display pixel and a near-infrared light emitting pixel illustrated in FIG. 7.

FIG. 13 is a cross-sectional view of an embodiment of the present disclosure, schematically illustrating the cross-sectional structure of a first display pixel SP1 and a near-infrared light emitting pixel ESP illustrated in FIG. 7.

Referring to FIG. 13, in each of first through third display pixel areas in which first through third display pixels SP1 through SP3 are formed, a light emitting element layer ELL is formed on a thin-film transistor layer TFTL, and a color filter layer CFL and a cover window CW are formed on the light emitting element layer ELL.

On the other hand, a light transmission hole CHH may be formed in an area in which each near-infrared light emitting pixel ESP is formed, for example, in an area in which a fourth light emitting unit ELU4 of each near-infrared light emitting pixel ESP is formed. In addition, a near-infrared light emitting panel FC1 that outputs near-infrared light through the light transmission hole CHH may be disposed on a rear surface of a substrate SUB. The near-infrared light emitting panel FC1 may include at least one near-infrared light emitting element FCD disposed at each position corresponding to the light transmission hole CHH.

Figure 14:
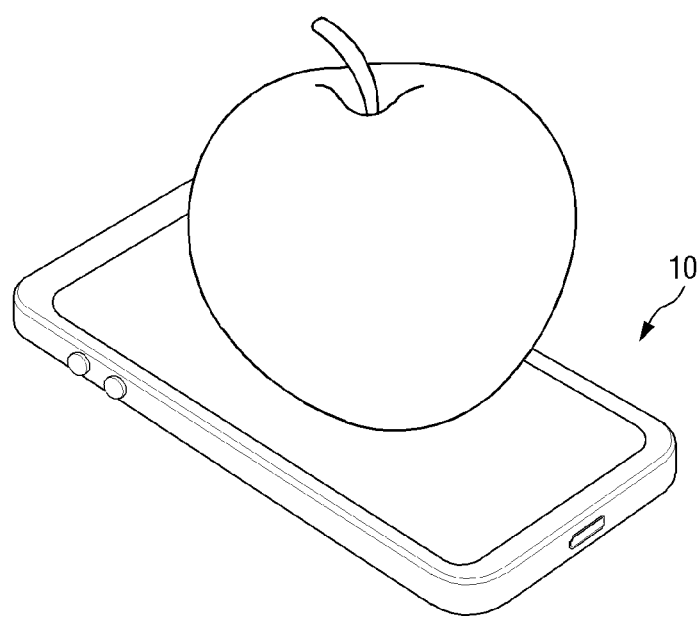
FIG. 14 is referred to in describing a method of measuring sugar content using the display device according to an embodiment.

FIG. 14 is referred to in describing a method of measuring sugar content using the display device 10 according to an embodiment.

Referring to FIG. 14, in a state in which a fruit or a vegetable is placed, each of the near-infrared light emitting pixels ESP arranged in the display area DA of the display device 10 may receive a data voltage of a data wiring DL according to a display scan signal and an emission control signal of the display scan driver 110, and emit light by supplying a driving current to a light emitting element according to the data voltage.

On the other hand, each of the light sensing pixels LSP arranged in the display area DA generates a light sensing signal corresponding to the amount of reflected light incident from the front side, and outputs the light sensing signal to a light sensing wiring ERL in response to a sensing scan signal from the light sensing scan driver 120. Each of the light sensing pixels LSP may sense reflected light in a near-infrared wavelength band incident from the front side, for example, light in a band of about 610 nm to about 900 nm according to the emission wavelength band of the near-infrared light emitting pixels ESP, and output a light sensing signal to a light sensing wiring ERL.

The component detection circuit 400 modulates the light sensing signals of the light sensing pixels LSP respectively received through the light sensing wirings ERL into digital signals. Then, the digital light sensing signals are analyzed using a preset component analysis algorithm or component analysis program to generate and store component detection data.

For example, the component detection circuit 400 may analyze the water content, acidity, chromaticity, chlorophyll, hardness, etc. of fruit, vegetables, coffee beans, etc. according to magnitude values of the light sensing signals by comparing the component detection data including the magnitude values of the light sensing signals with preset comparison data. For example, since the absorbance and reflectance of near-infrared light vary according to the water content, acidity, chromaticity, chlorophyll, hardness, etc. of fruit, vegetables, coffee beans, etc., the water content, acidity, chromaticity, chlorophyll, hardness, etc. of the fruit, vegetables, coffee beans, etc. can be analyzed according to the magnitude values of the light sensing signals.

Figure 15:
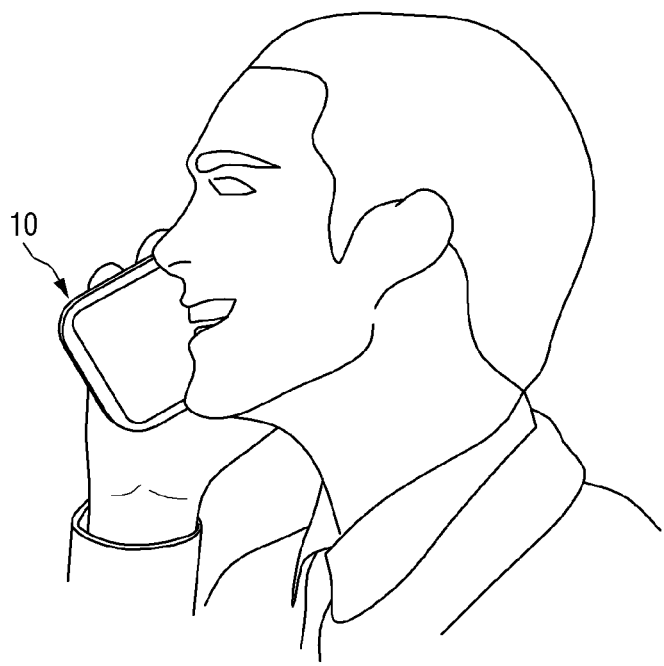
FIG. 15 is referred to in describing a method of measuring a skin moisture level using the display device according to an embodiment.

FIG. 15 is referred to in describing a method of measuring a skin moisture level using the display device 10 according to an embodiment.

Referring to FIG. 15, in a phone call state, each of the light sensing pixels LSP arranged in the display area DA generates a light sensing signal corresponding to the amount of reflected light incident from the front side, and outputs the light sensing signal to a light sensing wiring ERL in response to a sensing scan signal from the light sensing scan driver 120. Each of the light sensing pixels LSP may sense reflected light in a near-infrared wavelength band incident from the front side, for example, light in a band of about 610 nm to about 900 nm according to the emission wavelength band of the near-infrared light emitting pixels ESP, and output a light sensing signal to a light sensing wiring ERL.

The component detection circuit 400 modulates the light sensing signals of the light sensing pixels LSP respectively received through the light sensing wirings ERL into digital signals. Then, the digital light sensing signals are analyzed using a preset component analysis algorithm or component analysis program to generate and store component detection data. For example, the component detection circuit 400 may analyze skin condition information such as skin moisture level, the amount of sebum, fat layer thickness, and the amount of melanin according to magnitude values of the light sensing signals by comparing the component detection data including the magnitude values of the light sensing signals with preset comparison data. For example, since the absorbance and reflectance of near-infrared light vary according to skin conditions such as skin moisture level, the amount of sebum, fat layer thickness and the amount of melanin, the skin condition information such as the skin moisture level, the amount of sebum, fat layer thickness and the amount of melanin can be analyzed according to the magnitude values of the light sensing signals.

Figure 16:
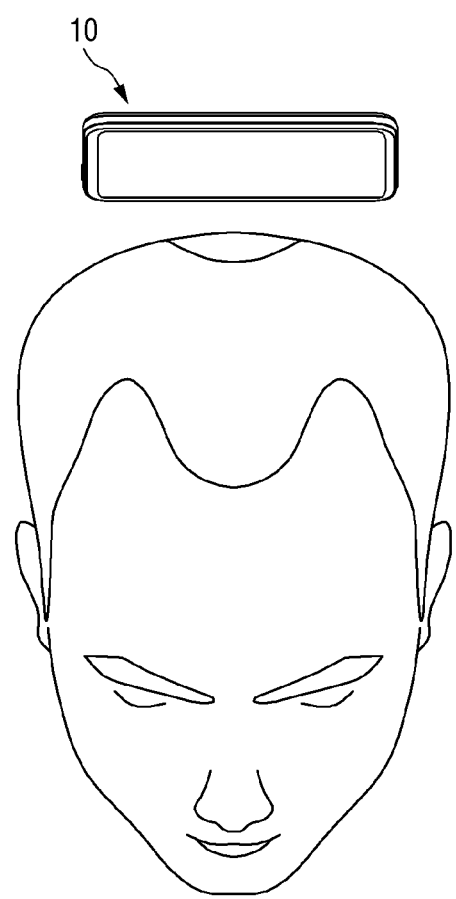
FIG. 16 is referred to in describing a scalp inspection method using the display device according to an embodiment.

FIG. 16 is referred to in describing a scalp inspection method using the display device 10 according to an embodiment.

Referring to FIG. 16, in a state in which the display device 10 is placed above the scalp, each of the light sensing pixels LSP may emit near-infrared light to inspect scalp conditions. Here, each of the light sensing pixels LSP may sense reflected light in a near-infrared wavelength band incident from the front side and output a light sensing signal to a light sensing wiring ERL.

The component detection circuit 400 generates and stores component detection data by analyzing the light sensing signals using a preset component analysis algorithm or component analysis program. For example, the component detection circuit 400 may analyze scalp information such as moisture and oiliness levels of the scalp, the size of pores and the amount of sebum according to magnitude values of the light sensing signals by comparing the component detection data including the magnitude values of the light sensing signals with preset comparison data. For example, since the absorbance and reflectance of near-infrared light vary according to scalp conditions such as moisture and oiliness levels of the scalp, the size of pores and the amount of sebum, the scalp condition information such as the moisture and oiliness levels of the scalp, the size of pores and the amount of sebum can be analyzed according to the magnitude values of the light sensing signals.

Figure 17:
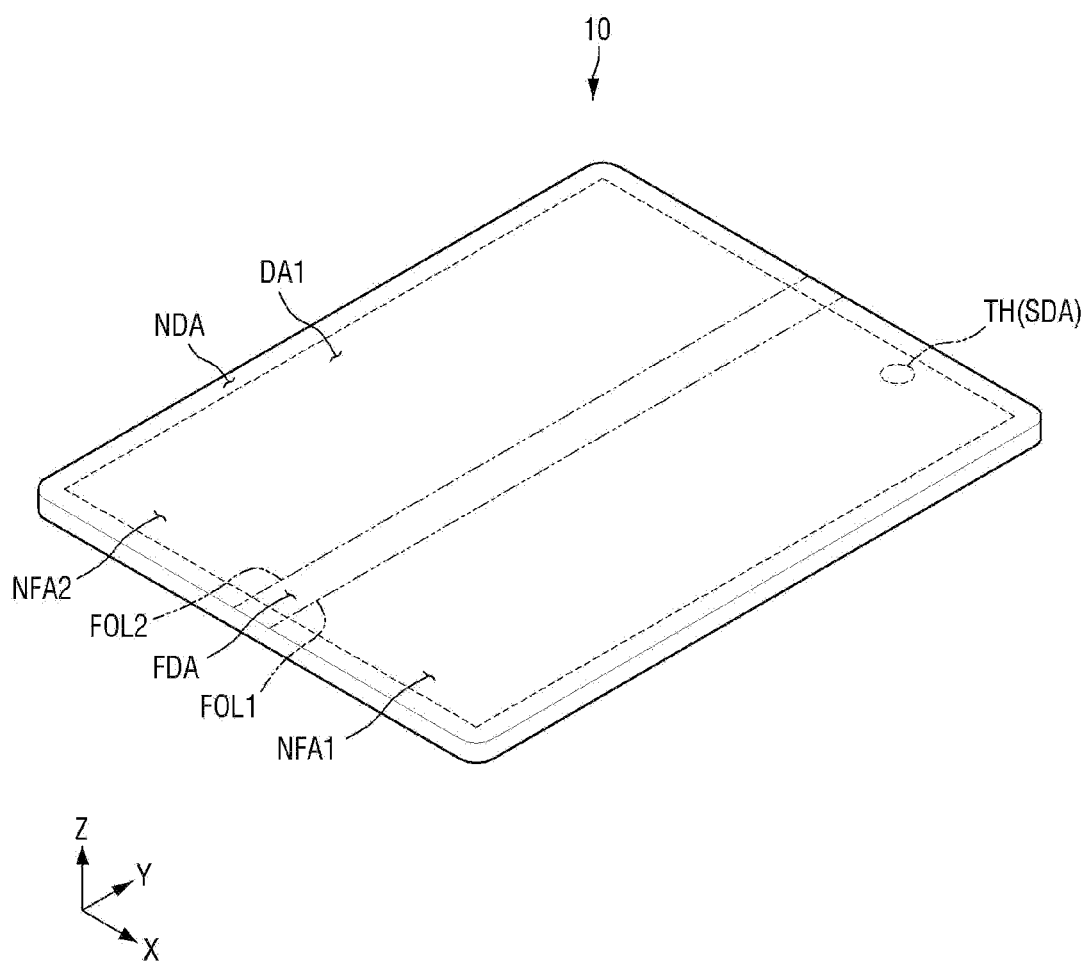
FIGS. 17 and 18 are perspective views of a display device according to an embodiment.
Figure 18:
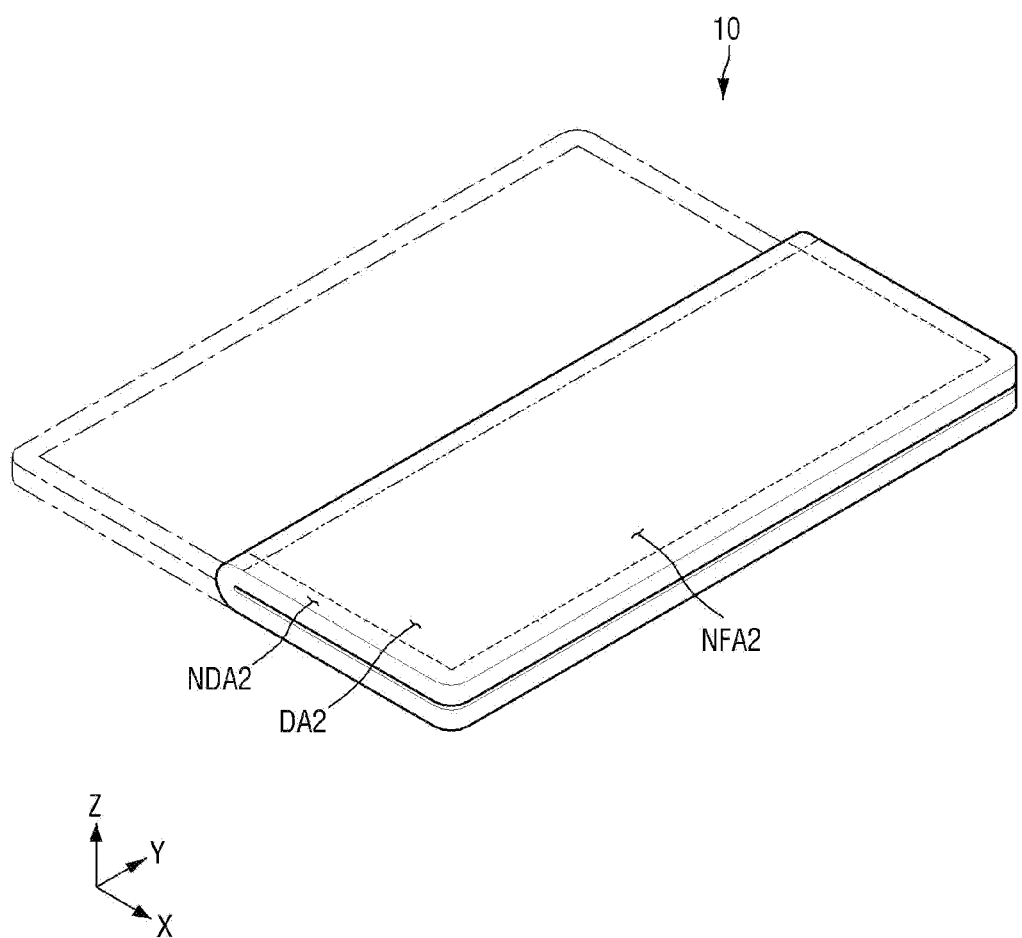

FIGS. 17 and 18 are perspective views of a display device 10 according to an embodiment.

In FIGS. 17 and 18, the display device 10 is illustrated as a foldable display device that is folded in a first direction (X-axis direction). The display device 10 may maintain both a folded state and an unfolded state. The display device 10 may be folded in an in-folding manner in which its front surface is disposed inside. When the display device 10 is bent or folded in the in-folding manner, portions of the front surface of the display device 10 may face each other. Alternatively, the display device 10 may be folded in an out-folding manner in which its front surface is disposed outside. When the display device 10 is bent or folded in the out-folding manner, portions of a rear surface of the display device 10 may face each other.

A first non-folding area NFA1 may be disposed on a side, e.g., a right side of a folding area FDA. A second non-folding area NFA2 may be disposed on the other side, e.g., a left side of the folding area FDA. A touch sensing unit TSU according to an embodiment of the present disclosure may be formed and disposed in each of the first non-folding area NFA1 and the second non-folding area NFA2.

A first folding line FOL1 and a second folding line FOL2 may extend in a second direction (Y-axis direction), and the display device 10 may be folded in the first direction (X-axis direction). Therefore, since a length of the display device 10 in the first direction (X-axis direction) can be reduced to about half, a user can easily carry the display device 10.

The first folding line FOL1 and the second folding line FOL2 do not necessarily extend in the second direction (Y-axis direction) according to embodiments. For example, the first folding line FOL1 and the second folding line FOL2 may extend in the first direction (X-axis direction), and the display device 10 may be folded in the second direction (Y-axis direction) according to embodiments. In this case, a length of the display device 10 in the second direction (Y-axis direction) may be reduced to about half. Alternatively, the first folding line FOL1 and the second folding line FOL2 may extend in a diagonal direction of the display device 10 between the first direction (X-axis direction) and the second direction (Y-axis direction). In this case, the display device 10 may be folded in a triangular shape.

When the first folding line FOL1 and the second folding line FOL2 extend in the second direction (Y-axis direction), a length of the folding area FDA may be smaller in the first direction (X-axis direction) than in the second direction (Y-axis direction). In addition, a length of the first non-folding area NFA1 in the first direction (X-axis direction) may be greater than the length of the folding area FDA in the first direction (X-axis direction). A length of the second non-folding area NFA2 in the first direction (X-axis direction) may be greater than the length of the folding area FDA in the first direction (X-axis direction).

A first display area DA1 may be disposed on the front surface of the display device 10. The first display area DA1 may overlap the folding area FDA, the first non-folding area NFA1, and the second non-folding area NFA2. Therefore, when the display device 10 is unfolded, an image may be displayed in a forward direction on the folding area FDA, the first non-folding area NFA1, and the second non-folding area NFA2 of the display device 10.

A second display area DA2 may be disposed on the rear surface of the display device 10. The second display area DA2 may overlap the second non-folding area NFA2.

Therefore, when the display device 10 is folded, an image may be displayed in the forward direction on the second non-folding area NFA2 of the display device 10.

Although a through hole TH in which a camera SDA or the like is formed is disposed in the first non-folding area NFA1 in FIGS. 17 and 18, embodiments of the present disclosure are not limited thereto. For example, according to embodiments, the through hole TH or the camera SDA may also be disposed in the second non-folding area NFA2 or the folding area FDA.

In the through hole TH, at least one near-infrared light emitting element FCD that emits near-infrared light and at least one light sensing element that receives near-infrared reflected light may be further formed. Accordingly, near-infrared light may be emitted by the at least one near-infrared light emitting element FCD, and reflected light in a near-infrared wavelength band incident from a front side may be sensed through the at least one light sensing element.

A component detection circuit 400 may analyze light sensing signals using, for example, a preset component analysis algorithm or component analysis program, and detect component information of fruit, skin, etc. according to magnitude values of the light sensing signals.

Figure 19:
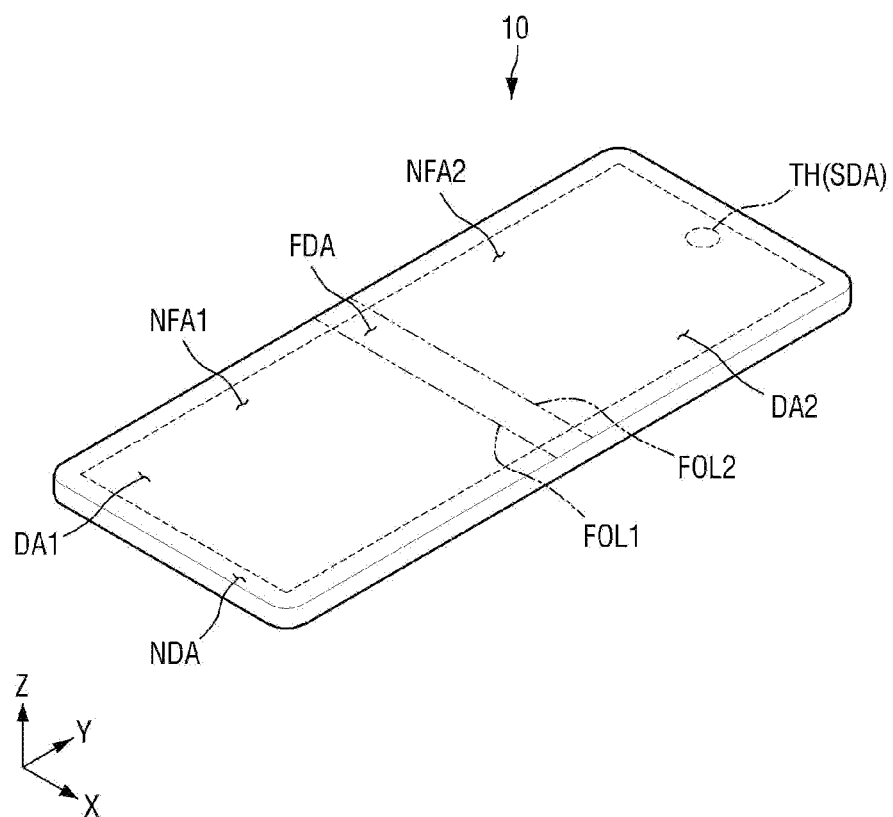
FIGS. 19 and 20 are perspective views of a display device according to an embodiment.
Figure 20:
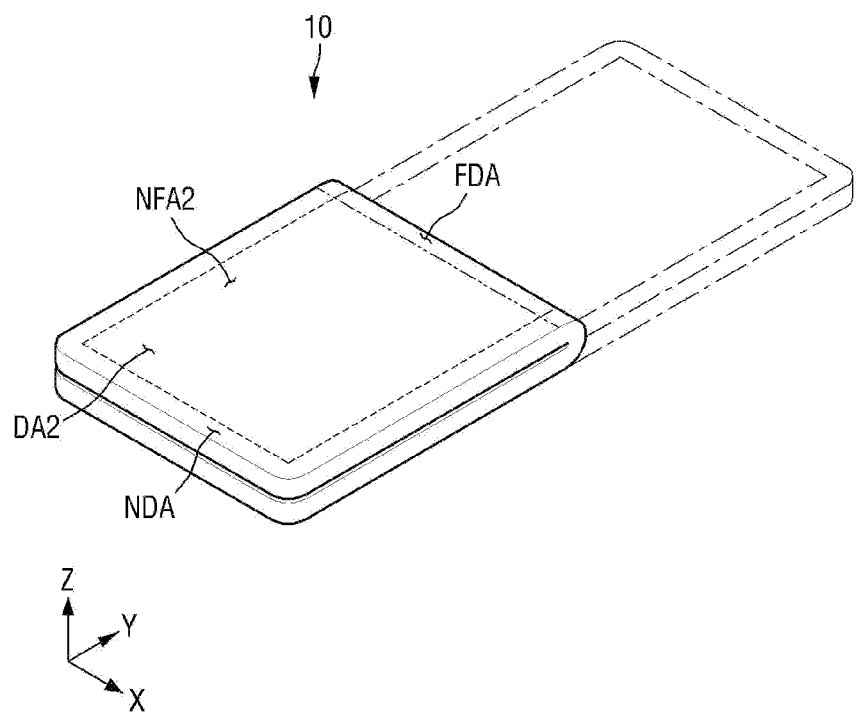

FIGS. 19 and 20 are perspective views of a display device 10 according to an embodiment.

In FIGS. 19 and 20, the display device 10 is illustrated as a foldable display device that is folded in the second direction (Y-axis direction). The display device 10 may maintain both a folded state and an unfolded state. The display device 10 may be folded in an in-folding manner in which its front surface is disposed inside. When the display device 10 is bent or folded in the in-folding manner, portions of the front surface of the display device 10 may face each other. Alternatively, the display device 10 may be folded in an out-folding manner in which its front surface is disposed outside. When the display device 10 is bent or folded in the out-folding manner, portions of a rear surface of the display device 10 may face each other.

The display device 10 may include a folding area FDA, a first non-folding area NFA1, and a second non-folding area NFA2. The folding area FDA may be an area in which the display device 10 is folded, and the first non-folding area NFA1 and the second non-folding area NFA2 may be areas where the display device 10 is not folded. The first non-folding area NFA1 may be disposed on a side, e.g., a lower side of the folding area FDA. The second non-folding area NFA2 may be disposed on the other side, e.g., an upper side of the folding area FDA.

A touch sensing unit TSU according to an embodiment of the present disclosure may be formed and disposed in each of the first non-folding area NFA1 and the second non-folding area NFA2.

On the other hand, the folding area FDA may be an area that is bent with a predetermined curvature along a first folding line FOL1 and a second folding line FOL2. Therefore, the first folding line FOL1 may be a boundary between the folding area FDA and the first non-folding area NFA1, and the second folding line FOL2 may be a boundary between the folding area FDA and the second non-folding area NFA2.

The first folding line FOL1 and the second folding line FOL2 may extend in the first direction (X-axis direction) as illustrated in FIGS. 19 and 20, and the display device 10 may be folded in the second direction (Y-axis direction). Therefore, since a length of the display device 10 in the second direction (Y-axis direction) can be reduced to about half, a user can easily carry the display device 10.

The first folding line FOL1 and the second folding line FOL2 may not necessarily extend in the first direction (X-axis direction) according to embodiments. For example, according to embodiments, the first folding line FOL1 and the second folding line FOL2 may extend in the second direction (Y-axis direction), and the display device 10 may be folded in the first direction (X-axis direction). In this case, a length of the display device 10 in the first direction (X-axis direction) may be reduced to about half. Alternatively, the first folding line FOL1 and the second folding line FOL2 may extend in a diagonal direction of the display device 10 between the first direction (X-axis direction) and the second direction (Y-axis direction). In this case, the display device 10 may be folded in a triangular shape.

When the first folding line FOL1 and the second folding line FOL2 extend in the first direction (X-axis direction) as illustrated in FIGS. 19 and 20, a length of the folding area FDA may be smaller in the second direction (Y-axis direction) than in the first direction (X-axis direction). In addition, a length of the first non-folding area NFA1 in the second direction (Y-axis direction) may be greater than the length of the folding area FDA in the second direction (Y-axis direction). A length of the second non-folding area NFA2 in the second direction (Y-axis direction) may be greater than the length of the folding area FDA in the second direction (Y-axis direction).

A first display area DA1 may be disposed on the front surface of the display device 10. The first display area DA1 may overlap the folding area FDA, the first non-folding area NFA1, and the second non-folding area NFA2. Therefore, when the display device 10 is unfolded, an image may be displayed in the forward direction on the folding area FDA, the first non-folding area NFA1, and the second non-folding area NFA2 of the display device 10.

A second display area DA2 may be disposed on the rear surface of the display device 10. The second display area DA2 may overlap the second non-folding area NFA2. Therefore, when the display device 10 is folded, an image may be displayed in the forward direction on the second non-folding area NFA2 of the display device 10.

Although a through hole TH in which a camera SDA or the like is placed is disposed in the second non-folding area NFA2 in FIGS. 19 and 20, embodiments of the present disclosure are not limited thereto. For example, according to embodiments, the through hole TH may also be disposed in the first non-folding area NFA1 or the folding area FDA.

As described above, in the through hole TH, at least one near-infrared light emitting element FCD that emits near-infrared light and at least one light sensing element that receives near-infrared reflected light may be further formed. Accordingly, near-infrared light may be emitted by the at least one near-infrared light emitting element FCD, and reflected light in a near-infrared wavelength band incident from a front side may be sensed through the at least one light sensing element.

A component detection circuit 400 may analyze light sensing signals using, for example, a preset component analysis algorithm or component analysis program, and detect component information of, for example, fruit, skin, etc. according to magnitude values of the light sensing signals.

In display devices according to embodiments, when light emitted from image display pixels and near-infrared light emitting pixels is reflected by an object such as, for example, a body part, vegetable, fruit or plant, the reflected light may be sensed using light sensing pixels of a display panel to detect optical signals. In addition, the detected optical signals may be analyzed to extract various component information of the object. For example, since various component information of the object is extracted using the near-infrared light emitting pixels and the light sensing pixels arranged together with the image display pixels, application fields and utilization of the display devices can be further increased.

As is traditional in the field of the present invention, embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, etc., which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions.

The effects of embodiments of the present disclosure are not restricted to the one set forth herein.

While the present disclosure has been particularly shown and described with reference to embodiments thereof, it will be understood by those of ordinary skill in the art that various changes in form and detail may be made therein without departing from the spirit and scope of the present disclosure as defined by the following claims.

What is claimed is:

1. A display device, comprising:
    a plurality of display pixels, which display an image, arranged in a display area of a display panel;
    a plurality of near-infrared light emitting pixels, which emit near-infrared light, alternately arranged with the display pixels;
    a plurality of light sensing pixels, which sense reflected light incident from a front side of the display device, alternately arranged with the display pixels,
    wherein three display pixels that respectively display red light, green light and blue light among the display pixels and one near-infrared light emitting pixel among the near-infrared light emitting pixels form each of a plurality of first unit pixels,
    wherein in each of the first unit pixels, the display pixel that displays the red light and the display pixel that displays the blue light oppose and are aligned with each other in a first direction in which a plurality of scan wirings extend, and the display pixel that displays the green light and the one near-infrared light emitting pixel are distinct from each other and oppose and are aligned with each other in a second direction in which a plurality of data wirings extend;
    a display scan driver that supplies a plurality of display scan signals to the display pixels and the near-infrared light emitting pixels;
    a component detection circuit that analyzes component information according to light sensing signals reflected from the front side of the display device by using the light sensing signals, which are received from the light sensing pixels; and
    a main driving circuit that controls driving timings of the display pixels, the light emitting pixels, and the display scan driver.

2. The display device of claim 1, wherein the display pixels, the near-infrared light emitting pixels, and the light sensing pixels are arranged in a matrix along the first direction and the second direction.

3. The display device of claim 2, wherein three display pixels that respectively display the red light, the green light and the blue light among the display pixels and one light sensing pixel from among the light sensing pixels form each of a plurality of second unit pixels, and the first and second unit pixels are alternately arranged in the matrix along the first direction and the second direction.

4. The display device of claim 3, wherein the first unit pixels and the second unit pixels are alternately arranged in a quad structure or a Pentile™ matrix structure along the first and second directions.

5. The display device of claim 2, wherein each of the near-infrared light emitting pixels receives a data voltage of a data wiring according to a display scan signal and an emission control signal from the display scan driver and emits near-infrared light by supplying a driving current to a light emitting element according to the data voltage, and the data voltage applied to each near-infrared light emitting pixel is about equal to a data voltage applied to each blue display pixel.

6. The display device of claim 1, further comprising:
    a light sensing driver that sequentially supplies a plurality of sensing scan signals to the light sensing pixels,
    wherein the light sensing pixels generate light sensing signals corresponding to amounts of reflected light incident from the front side among the light sensing signals, and transmit the generated light sensing signals to the component detection circuit by sequentially responding to the sensing scan signals received through light sensing scan wirings.

7. The display device of claim 1, wherein the light sensing pixels generate light sensing signals corresponding to amounts of reflected light incident from the front side among the light sensing signals, and transmit the generated light sensing signals to the component detection circuit by sequentially responding to the display scan signals received from the display scan driver through display scan wirings.

8. The display device of claim 1, wherein the component detection circuit modulates the light sensing signals of the light sensing pixels respectively received through light sensing wirings into digital signals, and
    generates, outputs and stores component detection data by analyzing the digital light sensing signals using a preset component analysis algorithm or component analysis program.

9. The display device of claim 8, wherein the main driving circuit generates digital video data corresponding to the component detection data according to the component detection data analyzed by the component detection circuit, or executes an application program that displays the component detection data in text or graphic form and generates the digital video data so that the component detection data is displayed in the display area in text or graphic form according to the graphic form and type of the application program.

10. The display device of claim 1, wherein each of the near-infrared light emitting pixels comprises:
    a light emitting unit that emits near-infrared light; and
    a pixel driving unit that supplies a driving current to a light emitting element of the light emitting unit.

11. The display device of claim 10, wherein the light emitting element of the light emitting unit comprises at least one organic material selected from copper phthalocyanine (CuPc), N,N'-Di (naphthalene-1-yl)-N,N'-diphenyl-benzidine (NPB) and tris-8-hydroxyquinoline aluminum (Alq3), and emits light in a blue wavelength band, and
    a wavelength conversion layer is disposed on a front surface of the light emitting unit and shifts the light in the blue wavelength band to light in a near-infrared wavelength band and outputs the light in the near-infrared wavelength band.

12. The display device of claim 10, wherein the light emitting element of the light emitting unit comprises at least one organic material selected from a low molecular weight boron-dipyrromethene derivative (BODIPY-Ph), acetone containing a low molecular weight boron-dipyrromethene derivative (BODIPY-Ph), hydrocarbon (e.g., rubrene), N,N'-Di (naphthalen-1-yl)-N,N'-diphenyl-benzidine (NPB) and tris-8-hydroxyquinoline aluminum (Alq3), and emits light in a near-infrared wavelength band.

13. The display device of claim 10, wherein the light emitting element of the light emitting unit comprises at least one organic material and emits light in a blue wavelength band, and a wavelength conversion layer is attached to a front surface or a rear surface of a cover window disposed on a front surface of the light emitting unit, and shifts the light in the blue wavelength band to light in a near-infrared wavelength band and outputs the light in the near-infrared wavelength band.

14. The display device of claim 1, wherein light transmission holes are respectively formed in areas where the near-infrared light emitting pixels are formed, and a near-infrared light emitting panel that outputs near-infrared light through the light transmission holes among the near-infrared light emitting pixels is disposed on a rear surface of the display panel, wherein the near-infrared light emitting panel comprises one or more near-infrared light emitting elements respectively disposed at positions corresponding to the light transmission holes.

15. A display device, comprising:

a plurality of display pixels, which display an image, arranged in a display area of a display panel;

a plurality of near-infrared light emitting pixels, which emit near-infrared light, alternately arranged with the display pixels;

a plurality of light sensing pixels, which sense reflected light incident from a front side of the display device, alternately arranged with the display pixels, wherein three display pixels that respectively display red light, green light and blue light among the display pixels and one near-infrared light emitting pixel among the near-infrared light emitting pixels form each of a plurality of first unit pixels, wherein in each of the first unit pixels, the display pixel that displays the red light and the display pixel that displays the blue light oppose and are aligned with each other in a first direction in which a plurality of scan wirings extend, and the display pixel that displays the green light and the one near-infrared light emitting pixel are distinct from each other and oppose and are aligned with each other in a second direction in which a plurality of data wirings extend;

a display scan driver that supplies a plurality of display scan signals to the display pixels and the near-infrared light emitting pixels;

a light sensing driver that sequentially supplies sensing scan signals to the light sensing pixels;

a component detection circuit that analyzes component information according to light sensing signals reflected from the front side of the display device by using the light sensing signals, which are received from the light sensing pixels;

a touch sensing circuit that detects a user's touch and coordinate data of a touch position through touch electrodes of a touch sensing unit; and a main driving circuit that controls driving timings of the display pixels, the light emitting pixels, the light sensing driver, and the display scan driver.

16. The display device of claim 15, wherein the component detection circuit modulates the light sensing signals of the light sensing pixels respectively received through light sensing wirings into digital signals, and generates, outputs and stores component detection data by analyzing the digital light sensing signals using a preset component analysis algorithm or component analysis program.

17. The display device of claim 15, wherein three display pixels that respectively display the red light, the green light and the blue light among the display pixels and one light sensing pixel from among the light sensing pixels form each of a plurality of second unit pixels, wherein in each of the second unit pixels, the display pixel that displays red light and the display pixel that displays blue light oppose each other in the first direction, and the display pixel that displays green light and the one light sensing pixel oppose each other in the second direction.

18. The display device of claim 1, wherein three display pixels that respectively display the red light, the green light and the blue light among the display pixels and one light sensing pixel from among the light sensing pixels form each of a plurality of second unit pixels, wherein in each of the second unit pixels, the display pixel that displays red light and the display pixel that displays blue light oppose each other in the first direction, and the display pixel that displays green light and the one light sensing pixel oppose each other in the second direction.

* * * * *